(12) United States Patent
Kimura et al.

(10) Patent No.: US 6,413,620 B1
(45) Date of Patent: Jul. 2, 2002

(54) CERAMIC WIRING SUBSTRATE AND METHOD OF PRODUCING THE SAME

(75) Inventors: Tetsuya Kimura; Katsuhiko Onitsuka; Katsura Hayashi; Shinya Kawai; Akihiko Nishimoto, all of Kokubu (JP)

(73) Assignee: Kyocera Corporation, Kyoto (JP)

(*) Notice: Subject to any disclaimer, the term of this patent is extended or adjusted under 35 U.S.C. 154(b) by 0 days.

(21) Appl. No.: 09/607,151

(22) Filed: Jun. 29, 2000

(30) Foreign Application Priority Data

| Jun. 30, 1999 | (JP) | ............................................. | 11-185829 |
| Jun. 30, 1999 | (JP) | ............................................. | 11-185929 |
| Sep. 28, 1999 | (JP) | ............................................. | 11-275055 |
| Dec. 24, 1999 | (JP) | ............................................. | 11-366870 |

(51) Int. Cl.[7] ............................................. B32B 3/00
(52) U.S. Cl. ........................ 428/210; 428/209; 428/901; 174/251; 174/255
(58) Field of Search .......................... 428/210, 901, 428/209; 174/251, 255, 250

(56) References Cited

U.S. PATENT DOCUMENTS

| 5,102,749 | A | * | 4/1992 | Enloe et al. ................ 428/698 |
| 5,658,835 | A | * | 8/1997 | Onitani et al. ................ 501/9 |
| 6,030,684 | A | * | 2/2000 | Czubarow et al. ........... 428/65.3 |
| 6,201,307 | B1 | * | 3/2001 | Terashi et al. ............... 257/746 |
| 6,207,259 | B1 | * | 3/2001 | Iino et al. .................... 428/209 |
| 6,207,905 | B1 | * | 3/2001 | Taga et al. ................... 428/209 |
| 6,232,251 | B1 | * | 5/2001 | Terashi et al. ................. 501/5 |

FOREIGN PATENT DOCUMENTS

| JP | 63-14493 | 1/1988 |
| JP | 4-293978 | 10/1992 |
| JP | 5-28867 | 2/1993 |
| JP | 5-102666 | 4/1993 |
| JP | 7-86743 | 3/1995 |

* cited by examiner

*Primary Examiner*—Cathy Lam
(74) *Attorney, Agent, or Firm*—Hogan & Hartson, L.L.P.

(57) ABSTRACT

Wiring substrate including an insulating substrate made of glass ceramics and having Young's modulus of 120 GPa or less, and a wiring circuit layer made of a high-purity metal conductor in concentration of 99% by weight or more formed on the surface of the insulating substrate and/or inside thereof. This wiring substrate may be a multi-layer wiring substrate that has a plurality of wiring circuit layers. The wiring circuit layer is preferably made of a metal foil.

19 Claims, 5 Drawing Sheets

CERAMIC WIRING SUBSTRATE AND METHOD OF PRODUCING THE SAME

BACKGROUND OF THE INVENTION

1. Field of the Invention

The present invention relates to a wiring substrate suited for multi-layer wiring substrate and semiconductor device package, and a method of producing the same.

2. Description of the Related Art

Multi-layer ceramic wiring substrates that allow wiring with a relatively high density have been widely used for multi-layer wiring substrates used in, for example, packaging semiconductor devices. The multi-layer ceramic wiring substrate comprises an insulating substrate made of alumina, glass ceramics or the like, and a wiring conductor made of a metal such as W, Mo, Cu and Ag coated on the surface thereof. A cavity is formed in part of the insulating substrate so that a semiconductor device is housed in the cavity. The cavity is air-tightly encapsulated with a lid.

Semiconductor devices such as IC and LSI are made with increasingly high density. Accordingly, wiring substrates used in semiconductor device packages in which semiconductor devices are mounted are required to allow for increasingly higher density, lower resistance, smaller size and lighter weight. Wiring substrates used for hybrid integrated circuits where various electronics components are mounted are also subjected to the same requirements. For these applications, a glass ceramic wiring substrate that is capable of achieving a lower dielectric constant than the alumina ceramics material and allows for lower resistance of a wiring circuit layer is viewed as promising. Glass ceramics comprises glass or a mixture of glass and a ceramic filler. The glass ceramics can be fired at a temperature lower than 1000° C., and therefore can be fired together with a metal having a low resistance such as copper or silver, thereby making it possible to produce a wiring substrate that has a low-resistance wiring circuit layer.

When forming a wiring conductor layer on the glass ceramic wiring substrate, a metallizing paste including a wiring conductor made of a metal such as Cu or Ag as a principal component is printed by screen printing on an insulating substrate made of glass ceramics. However, with such a process, it is difficult to form wiring lines of width not greater than 100 μm (particularly 80 μm or less). As a result, there has been a limitation to the reduction of wiring width, posing a threat of blocking the progress toward higher packaging density, smaller size and lighter weight. There has also been such a problem that there exist many voids and grain boundaries due to the formation of the wiring conductor by means of paste; therefore, it is difficult to decrease the electrical resistance. Also the conductive paste includes a filler such as ceramics or glass added thereto, in order to alleviate the difference in thermal shrinkage between the wiring circuit layer and the insulation layer during firing. This gives rise to another cause of hampering the effort to decrease the resistance of the wiring conductor layer.

As means for solving this problem, such a technique has been known that a wiring circuit layer is formed on the glass ceramic wiring substrate by etching a metal foil (see Unexamined Patent Publication (Kokai) No. 63-14493(1998)). However, this technique has such a problem as firing the metal foil and the glass ceramics causes the substrate to warp or crack, thus making it difficult to make practical use of the technique. This is because the glass ceramics shrinks during firing although the metal foil is a dense material and hardly shrinks.

To solve these problems, such a technique is known as forming layers (restricting sheets) of an inorganic composite, that is not sintered at the sintering temperature of the wiring substrate, on both sides of the glass ceramic wiring substrate whereon the wiring circuit layer of the metal foil is formed (see Unexamined Patent Publication (Kokai) No. 7-86743(1995)). When this laminate is sintered, planar shrinkage of the wiring substrate is restricted by the inorganic composite layers, so that the metal foil and the glass ceramics can be co-fired. Also techniques for firing a green sheet coated with a conductive paste printed on the surface thereof while restricting the planar contraction by similar means are disclosed in Unexamined Patent Publication (Kokai) Nos. 4-293978(1992), 5-28867(1993) and 5-102666(1993)

However, since the wiring circuit layer is made of the dense metal foil having high rigidity, and therefore hardly experiences thermal expansion and contraction, resulting in a significant thermal stress generated in the glass ceramics. As a result, crack would occur in the surface of the glass ceramic wiring substrate having the wiring circuit layer formed thereon in the subsequent cooling process, after the co-firing, and eventually leading to the breakage of the substrate.

There has also been such a problem that the glass ceramics is prone to crack when restricting sheet layer is removed.

The glass ceramic wiring substrate of the prior art has a thermal expansion coefficient within a range from 4 to 7 ppm/° C. at a temperature within a range from 40 to 400° C. Meanwhile printed circuit boards comprising glass-epoxy insulation layer with a Cu wiring circuit layer formed thereon are the most frequently used for the external circuit board whereon the wiring substrate is to be mounted. The printed circuit board has a very high thermal expansion coefficient of 12 to 18 ppm/° C. Heat generated during operation of a semiconductor device mounted on a wiring substrate or in a semiconductor device package is transmitted to both the wiring substrate and the printed circuit board. Thus as the operation of the semiconductor device is activated and stopped repeatedly, significant thermal stress is generated due to the difference in the thermal expansion coefficient between the wiring substrate and the printed circuit board.

This thermal stress acts on the periphery of the pad on the bottom surface of the wiring substrate and on the interface of joining wiring conductors of the external circuit board and terminals. This results in such a problem as the connection pad peels off the insulating substrate or the terminals peel off the wiring conductor. Thus it has been impossible to maintain stable electrical connection between the wiring substrate or the package and the printed circuit board over a long period of time.

The glass ceramics green sheet and the restricting sheet are joined by an organic component such as an organic binder included in these sheets. As a result, when the organic component has been decomposed and evaporated in the sintering process, shrinkage of the green sheet is restricted only by the frictional force between the restricting sheet and the green sheet.

However, the restricting sheet usually consists of only such components that becomes sintered at high temperature as alumina so that the restricting sheet would not be easily sintered. That is, the restricting sheet hardly includes glass component that would be turned into liquid phase, and takes the form of porous body in the sintering process.

The green sheet consists of a mixture of glass powder and ceramics filler powder. In the sintering process, the glass component contained in the green sheet forms liquid phase. The liquid phase component diffuses into the porous restricting sheet laminated on the surface of the green sheet. Consequently, glass content in the surface of the green sheet decreases and the surface whereon the restricting sheet is laminated tends to be insufficiently sintered.

Such a problem as described above is encountered more frequently as the glass ceramics composite includes more amorphous component after sintering the glass ceramics green sheet. As a result, surface of the wiring substrate becomes rough with many voids included therein. This causes such problems as lower strength of the substrate and diffusion of plating metal when the wiring circuit layer on the substrate surface is plated.

SUMMARY OF THE INVENTION

A first object of the present invention is to provide a ceramic wiring substrate that does not experience cracks or the like, and a method of producing the same.

A second object of the present invention is to provide a ceramic wiring substrate that has high reliability of connection to an external circuit board and a method of producing the same.

A third object of the present invention is to provide a ceramic wiring substrate that has good surface condition and a method of producing the same.

A fourth object of the present invention is to provide a ceramic wiring substrate that has high adhesive strength between an insulating substrate and a wiring circuit layer with high yield of production, and a method of producing the same.

The wiring substrate according to the first aspect of the present invention comprises an insulating substrate made of glass ceramics and having Young's modulus of 120 GPa or less, and a wiring circuit layer made of a high-purity metal conductor in concentration of 99% by weight or more formed on the surface of the insulating substrate and/or inside thereof.

The wiring substrate may be a multi-layer wiring substrate that has a plurality of wiring circuit layers.

The wiring substrate can be produced by the production method comprising the steps of making a green sheet or a plurality thereof made of a glass ceramics composite that is to have Young's modulus of 120 GPa or less after sintering, forming wiring circuit layer made of a high-purity metal conductor in concentration of 99% by weight or more formed on the surface of the green sheet or the respective surfaces of the plurality of green sheets and firing the green sheet whereon the wiring circuit layer is formed or the laminate of the plurality of green sheets whereon the wiring circuit layer is formed on each thereof at a temperature below the melting point of the high-purity metal conductor.

According to the present invention, since resistance of the wiring circuit layer is decreased by the use of the high-purity metal conductor and the insulating substrate has a low value of Young's modulus, cracks can be prevented from occurring. Such a wiring substrate can be provided that has excellent reliability of connection when mounted on a printed circuit board.

The wiring substrate according to the second aspect of the present invention comprises an insulating substrate made of glass ceramics, and a wiring circuit layer that is formed at least in the inside of the insulating substrate and is made of a metal conductor in concentration of 99% by weight or more, wherein a difference in the thermal expansion coefficient between the insulating substrate and the wiring circuit layer is 14 ppm/° C. or less at a temperature within a range from 25 to 800° C.

The wiring substrate according to the second aspect of the present invention can be produced in the production method comprising the steps of forming one or a plurality of green sheets made of glass ceramics which is to have thermal expansion coefficient that is different from that of the wiring circuit layer by 14 ppm/° C. or less at a temperature within a range from 25 to 800° C. after sintering, forming the wiring circuit layer made of a high-purity metal conductor in concentration of 99% by weight or more on the surface of the green sheet or the surfaces of the plurality of green sheets and firing the green sheet whereon the wiring circuit layer is formed or the laminate of the plurality of green sheets whereon the wiring circuit layer is formed on each thereof at a temperature below the melting point of the high-purity metal conductor.

According to the present invention, since the insulating substrate and the wiring circuit layer have a small difference in the thermal expansion coefficient therebetween, cracks can be suppressed from occurring during cooling after the sintering process. Also it is made possible to provide the wiring substrate having high reliability that is capable of maintaining stable electrical connection with an external circuit board made of such a material as glass epoxy over a long period of time.

The wiring substrate according to the third aspect of the present invention comprises an insulating substrate that is made of glass ceramics and includes 20% by volume or more amorphous component with less than 5% of the outer-most surface thereof being occupied by voids, and a wiring circuit layer made of a high-purity metal conductor of 99.5% by weight or more content formed on the surface of the insulating substrate and/or inside thereof.

The wiring substrate of this configuration can be produced in the production method comprising the steps of forming one or a plurality of green sheets made of glass ceramics composite that includes 20% by volume or more amorphous component after sintering, forming the wiring circuit layer made of a high-purity metal having conductor of 99.5% by weight or more content on the surface of the green sheet or the surfaces of the plurality of green sheets, forming a laminate having a restricting sheet that includes a low-sinterable ceramic material as a principal component and an amorphous component in 0.5 to 15% by volume being laminated on the surface on at least one side of the one green sheet or the green sheet laminate of the plurality of green sheets, firing the laminate at a temperature below the melting point of the high-purity metal conductor thereby to make the glass ceramic wiring substrate having the restricting sheet formed on the surface thereof, and removing the restricting sheet from the glass ceramic wiring substrate.

According to the present invention, since such a ceramic wiring substrate can be obtained that is provided with the wiring circuit layer made of a low-resistance metal such as Cu and Ag, wherein planar shrinkage can be restricted, finer wiring can be made thereon and the substrate surface is in good condition.

The wiring substrate according to the fourth aspect of the present invention comprises an insulating substrate made of ceramics and a wiring circuit layer made of a high-purity metal conductor of 99% by weight or more embedded in the ceramic insulating substrate so that the surfaces thereof are flush, wherein the wiring circuit layer has a cross section of inverted trapezoid shape in the direction perpendicular to the wiring direction. The angle made between the bottom and sloped side of the inverted trapezoid shape is preferably within a range from 45 to 80°.

The wiring substrate of this configuration can be produced in the production method comprising the steps of forming one or a plurality of green sheets made of ceramic insulating material, forming the wiring circuit layer having trapezoidal cross section in the direction perpendicular to the wiring direction by etching the high-purity metal conductor layer including 99% by weight or more metal component bonded onto the surface of a transfer film, transferring the wiring circuit layer by pressing the transfer film having the wiring circuit layer formed thereon onto the surface of the green sheet, embedding the wiring circuit layer into the surface of the green sheet and then peeling off the transfer film, and firing the one green sheet whereon the wiring circuit layer is formed or the laminate of the plurality of green sheets whereon the wiring circuit layer is formed on each thereof at a temperature below the melting point of the high-purity metal conductor.

According to the present invention, the ceramic wiring substrate having the wiring circuit layer of good adhesion with the insulating substrate can be obtained.

The above objects and other objects, features and effects of the present invention will be made apparent from the description of preferred embodiments that follows with reference to the accompanying drawings.

DESCRIPTION OF THE PREFERRED EMBODIMENTS

Figure 1:
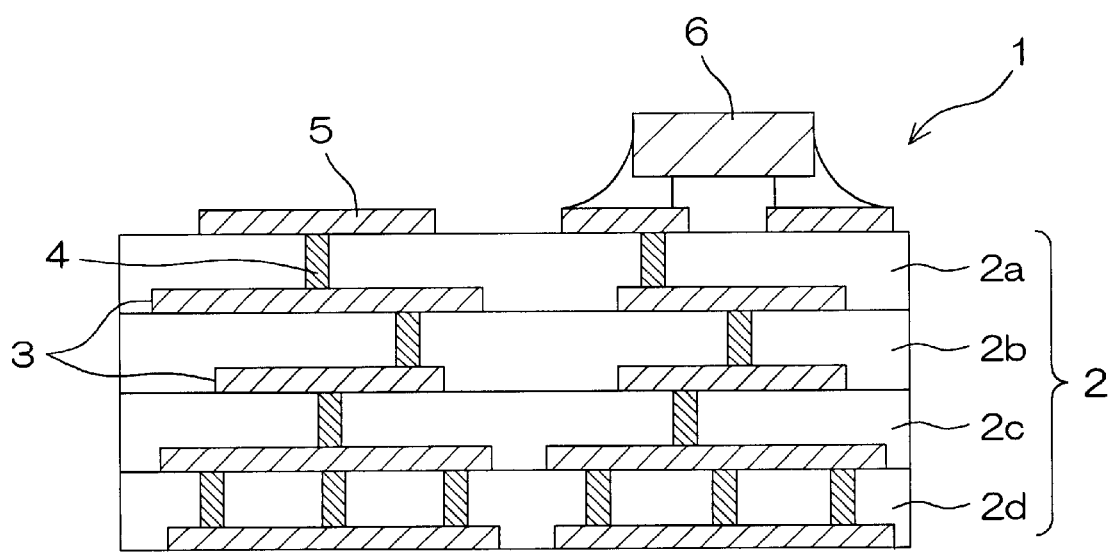
FIG. 1 is a schematic sectional view of a multi-layer wiring substrate according to one embodiment of the present invention.

FIG. 1 is a schematic sectional view of a multi-layer wiring substrate according to one embodiment of the present invention. The multi-layer wiring substrate 1 has an insulating substrate 2 that comprises a laminate made by laminating a plurality of glass ceramics insulation layers 2a to 2d. There are wiring circuit layers 3 made of high purity metal foils having thickness within a range from 3 to 20 μm (preferably from 10 to 15 μm) formed between the insulation layers 2a to 2d. A wiring circuit layer 5 having a thickness within a range from 3 to 20 μm (preferably from 10 to 15 μm) is formed on the surface of the insulating substrate 2.

Further, via hole conductors 4 having a diameter from 80 to 200 μm are formed to penetrate the glass ceramics insulation layers 2a to 2d in the direction of thickness. With this configuration, a network for achieving intended functional circuit is formed. Electronics components 6 such as semiconductor devices are mounted on the surface of the wiring circuit layer 5.

The insulation substrate 2 is formed from glass ceramics. The glass ceramics is made of a material having low Young's modulus not larger than 120 GPa, preferably 110 GPa or less and more preferably 100 GPa or less.

When Young's modulus is larger than 120 GPa, the insulating substrate 2 becomes prone to crack or break during cooling process after being co-sintered with the wiring circuit layer 3 made of the high-purity metal conductor.

Glass ceramics constituting the insulating substrate 2 are preferably prepared by firing glass powder or a mixture of glass powder and ceramic filler (inorganic filler) powder. The glass ceramics is preferably prepared by a firing a composition containing 10 to 70% by weight of a glass component and 30 to 90% by weight of a filler component.

The glass component preferably contains at least $SiO_2$ and at least one of $Al_2O_3$, $B_2O_3$, ZnO, PbO, an alkaline earth metal oxide and an alkaline metal oxide. Examples thereof include borosilicate series glass such as $SiO_2$–$B_2O_3$ series, $SiO_2$–$B_2O_3$–$Al_2O_3$ series and $SiO_2$–$B_2O_3$–$Al_2O_3$–MO series (wherein M represents Ca, Sr, Mg, Ba or Zn), alkaline silicate series glass, Ba series glass, Pb series glass and Bi series glass.

As the glass, there can be used those which are amorphous glass even if they are fired or those which crystallize, by firing, at least one kind of crystal of lithium silicate, cordierite, mullite, anorthite, diopside, celsian, spinel, gahnite, willemite, dolomite, petalite or substituted derivatives thereof.

As an inorganic filler (ceramic filler), for example, $SiO_2$ such as silica, silica glass, quartz and cristobalite, $Al_2O_3$, $ZrO_2$, mullite, forsterite, enstatite, cordierite and spinel are preferably used.

To enhance the thermal expansion coefficient of the insulating substrate 2 thereby to reduce a difference between the thermal expansion coefficient and that of the circuit layer 3, the insulating substrate 2 is preferably made of glass ceramics containing a glass component and inorganic filler. The glass component may be borosilicate glass such as zinc borosilicate glass, lead borosilicate glass and almino borosilicate glass, or lithium silicate glass. The glass component of the glass ceramics is a glass frit containing a plurality of oxides. At least one kind of crystal of quartz, cristobalite, enstatite, forsterite, tridymite, cordierite, mullite, anorthite, celsian, spinel, gahnite, willemite, dolomite, petalite, slawsonite, diopside or substituted derivatives thereof are crystallized in the porcelain. Among them, a crystal phase having a large thermal expansion coefficient such as quartz, cristobalite, enstatite, forsterite, tridymite and gahnite is preferably crystallized, thereby making it possible to enhance the thermal expansion coefficient of the insulating substrate 2.

As the inorganic filler component, for example, quartz, cristobalite and tridymite as $SiO_2$ crystal phases are preferably crystallized from a viewpoint of increasing the thermal expansion coefficient of the insulating substrate 2. Among them, quartz crystal phase (thermal expansion coefficient of 17.5 ppm/° C.) is preferably crystallized. The porcelain may contain amorphous $SiO_2$, alumina, mullite, cordierite, enstatite and forsterite as a trace component.

With the constitution described above, thermal expansion coefficient of the insulating substrate 2 at a temperature within a range from 25 to 800° C. becomes 6 ppm/° C. or higher, preferably 8 ppm/° C. or higher, and more preferably 10 ppm/° C. or higher.

The ceramics made by sintering the material of the composition described above includes various crystal phases such as one of ceramics filler, one crystallized from the glass component and one generated by reaction of the glass component and the ceramics filler. However, the glass ceramics used in the insulation substarate of this embodiment is preferably constituted from a ceramic material including 20% by volume or more amorphous component, namely glass.

When a ceramic material including 20% by volume or more amorphous component is sintered with a porous restricting sheet applied thereon, many voids are generated on the surface of the ceramics due to the diffusion of the glass component. This problem can be avoided by employing a special production process described later. The ceramic wiring substrate made in this production process has voids occupying not larger than 5% of the surface, preferably 3% or less. In other words, a wiring substrate having very dense and excellent surface property can be made.

The glass ceramics that constitutes the insulating substrate has low Young's modulus not higher than 120 GPa, preferably 110 GPa or lower and more preferably 100 GPa or lower. Thus, generation of stress can be reduced even when the wiring circuit layer made of a metal foil is used.

Young's modulus of glass ceramics varies significantly depending on the materials of the glass component and inorganic filler (ceramics filler), and the mix proportions of the components. When $Al_2O_3$ is used as the inorganic filler in 50% by weight or more, since $Al_2O_3$ has a high value of Young's modulus, Young's modulus of the resulting glass ceramics becomes higher than 120 GPa. In order to increase the thermal expansion and decrease the Young's modulus of the glass ceramics, it is preferable that the glass ceramics includes at least one from among $SiO_2$, forsterite and enstatite as the filler.

The wiring circuit layers 3, 5 are made of high-purity dense metal conductor including a metal component of 99% or higher purity in 99% by weight or higher (preferably 99.5% by weight or higher) concentration, wherein at least one kind selected from among Cu, Ag, Al, Au, Ni, Pt and Pd. In order to reduce the wiring width and reduce the resistance of the wiring circuit layers 3, 5, it is preferable to make the layers from metal foils. The metal foils may be grain-grown by firing.

When the wiring circuit layers 3, 5 are made of Cu foils, average thermal expansion coefficient of the wiring circuit layers 3, 5 at a temperature within a range from 25 to 800° C. is about 20.3 ppm/° C. By increasing the thermal expansion coefficient of the insulating substrate 2 as described above, a difference in the thermal expansion coefficient between the insulating substrate 2 and the wiring circuit layer 3 can be kept within 14 ppm/° C., preferably within 12 ppm/° C. more preferably within 10 ppm/° C. Thus adhesion of the insulating substrate 2 to the wiring circuit layer 3 can be improved thereby preventing cracks from occurring.

Thermal expansion coefficient of the insulating substrate 2 at a temperature within a range from 25 to 800° C. is 6 ppm/° C. or higher, preferably 8 ppm/° C. or higher. In this specification, unless otherwise specified, the difference in the thermal expansion coefficient refers to the largest value of thermal expansion coefficient difference in a temperature within a range from 25 to 800° C.

The via hole conductor 4 is preferably made by filling a via hole with a conductor consisting of components similar to those of the wiring circuit layers 3, 5.

The wiring circuit layer 5 formed on the surface of the multi-layer wiring substrate 1 is used as a pad for mounting the electronic component 6 such as IC chip, as a shielding conductor film, or further as a terminal electrode for connection with the external wiring board. The electronic component 6 is connected to the wiring circuit layer 5 by means of soldering, conductive adhesive or the like. Formed on the back of the insulating substrate 2 is an electrode pad for the connection to the external wiring board. The insulating substrate 2 may have a thick film resistor (not shown) made of such a material as tantalum silicide or molybdenum silicide or wiring protection film formed on the front surface thereof as required.

The multi-layer wiring substrate can be connected onto a conductive layer of an external circuit board, such as a mother board made by coating the surface of a substrate with the conductive layer, via connection terminals such as solder balls. The insulating substrate of the external circuit board is made by, for example, adding a filer component such as glass to a thermosetting resin such as epoxy resin, phenol resin, aramid resin, polyimide resin or polyolefin resin. The conductive layer contains a metal such as Cu, Au, Al, Ni and Pb—Sn. The external circuit board as described above has thermal expansion coefficient of 14 to 18 ppm/° C. at a temperature within a range from room temperature (25° C.) to 400° C.

Now the method of producing the multi-layer wiring substrate of this embodiment will be described below. First, the glass ceramics composite is prepared by mixing above-mentioned crystalline glass or amorphous glass and the inorganic filler component. An organic binder, a plasticizer, an organic solvent and the like are added to the mixture described above, thereby to prepare a slurry. The slurry is formed into a sheet by such method as doctor blade process, rolling or pressing, thereby to form a green sheet having a thickness within a range from about 50 to 500 μm.

As the organic binder, there can be used those that have conventionally been used in the ceramic green sheet.

Examples thereof include acrylic series homopolymer or copolymer (for example, acrylic acid, methacrylic acid, or homopolymer or copolymer of its ester, e.g. acrylate copolymer, methacrylate copolymer, acrylate-methacrylate copolymer, etc.) and homopolymers or copolymers of polyvinyl butyral series, polyvinyl alcohol series, acrylic-styrene series, polypropylene carbonate series and cellulose series.

Then, through holes for via holes of diameter within a range from 80 to 200 μm are formed in the green sheet by laser, micro drill, punching or the like, and the holes are filled with a conductive paste that constitutes the via hole conductor. The conductive paste is made by homogeneously mixing metal powder (powder of the same metal as or similar to the metal of which the wiring circuit layer is made) including Cu or Ag as the principal component, an organic binder consisting of acrylic resin, etc. and an organic solvent such as toluene, isopropyl alcohol and acetone, and the mixture is conditioned to have a proper viscosity. The organic binder is preferably mixed in the amount within a range from 0.5 to 15.0 parts by weight (more preferably from 0.5 to 5.0 parts by weight) with respect to 100 parts by weight of the metal component, while the organic solvent is preferably mixed in the amount within a range from 5 to 100 part5 by weight with respect to 100 parts by weight of the solid components and organic binder. A small amount of a glass component may also be added to the conductive paste.

Then, the wiring circuit layer made of the high-purity dense metal conductor (preferably a metal foil) is formed on the surface of the green sheet. The wiring circuit layer made of the metal foil can be formed by bonding the metal foil onto the surface of the green sheet, and then patterning the metal foil in a desired pattern by photo-etching or the like. However, there is a possibility of deteriorating the quality of the green sheet with the etching solution in the case of this process.

Therefore, the wiring circuit layer is formed by the transferring process in this embodiment. First, the wiring circuit layer having a mirror image pattern is formed on a transfer film made of a polymer or the like. This is done by bonding the high-purity metal conductor, particularly a high-purity metal foil that is made of the metal components described above with a thickness from 3 to 20 $\mu$m, onto the transfer film. Then, after a resist pattern of mirror image is applied onto the surface of this metal conductor, the conductor is etched and the resist is removed. This process makes it possible to make fine patterns without breakage or loosening of wiring. Thus fine wiring lines can be formed precisely with width of wiring line within 50 $\mu$m and spacing between wiring lines within 50 $\mu$m.

Then the wiring pattern is transferred onto the green sheet surface. That is, the transfer film carrying the wiring circuit layer of the mirror image formed thereon is positioned on the surface of the green sheet wherein the via hole conductors have been formed, and is pressed to laminate. As the transfer film is peeled off thereafter, one unit of the green sheet having the wiring connected to the via hole conductors is formed.

The laminate of green sheets 1 is formed by laminating a plurality of green sheets obtained in similar processes to the above, and pressing to laminate. For the lamination of the green sheets, a heat contact bonding process maybe employed in which heat and pressure are applied to the laminated green sheets. Alternatively, the green sheets may be heated and pressured with an adhesive consisting of an organic binder, a plasticizer, a solvent, etc. is applied between the sheets.

Then, in order to restrict the planar shrinkage, green sheet (restricting sheet) are made from an inorganic composite (consisting mainly of ceramic material) that cannot be sintered at the sintering temperature of the green sheet laminate 1. The restricting sheet is laminated by pressure onto one or both sides of the glass ceramic green sheet laminate 1, thereby to make the laminated substrate.

The restricting sheet is made by forming a slurry, prepared by mixing an organic binder, a plasticizer, a solvent, etc. to an inorganic component made from a low-sinterable ceramic material and glass, into a sheet by a doctor blade process. The inorganic component of the low-sinterable ceramic material is preferably made from a ceramic composite that does not consolidate at a temperature below 1000° C. Specifically, such a ceramic powder may be used that contains at least one kind of substance selected from among $Al_2O_3$, $SiO_2$, MgO, $ZrO_2$, BN and $TiO_2$ as the principal component. For the organic binder, the plasticizer and the solvent, materials similar to those used in the glass ceramics green sheet can be used.

The restricting sheet preferably contains 0.5 to 15% by volume of glass component, namely amorphous component. When the glass component content is less than 0.5by volume, the restricting sheet has less effect of restricting the shrinkage of the glass ceramics green sheet when sintered, and leads to conspicuous diffusion of the glass component from the glass ceramics green sheet in the sintering process, resulting in many voids generated in the surface of the glass ceramics after sintering. When the glass component content is more than 15% by volume, on the contrary, the restricting sheet tends to be sintered. That is, the restricting sheet is sintered and shrinks, thereby making it difficult to restrict the glass ceramics green sheet from shrinking. It is also made difficult to remove the restricting sheet from the glass ceramics after sintering. The content of glass in the restricting sheet is more preferably within a range from 1 to 10% by volume.

Softening point of the glass component contained in the restricting sheet is preferably not higher than the sintering temperature of the glass ceramics green sheet laminate, and higher than the temperature at which the organic component of the restricting sheet is decomposed and evaporated. Specifically, softening point of the glass component of the restricting sheet is preferably within a range from 450 to 1100° C. When the softening point of the glass is lower than 450° C., organic component may not be completely removed from the glass ceramics green sheet. That is, when removing the organic component, softened glass may block the passage where the decomposed or evaporated organic component is released. When the softening point of the glass is higher than 1100° C., on the contrary, the glass may not function as the binder to bond with the green sheet under the normal sintering conditions of the glass ceramics green sheet.

The glass component of the restricting sheet may be the same as or different from the glass component contained in the glass ceramics green sheet. In order to prevent diffusion of the glass from the glass ceramics green sheet, however, it is desirable to use the same glass component.

The restricting sheet laminated on one or both sides of the glass ceramics green sheet laminate is preferably made to a thickness that is not less than 10% of the thickness of the glass ceramics green sheet laminate. When the thickness is less than this, the restricting sheet may have insufficient restricting effect. In order to make it easy to evaporate the organic component and remove the restricting sheet from the glass ceramics substrate, thickness of the restricting sheet is preferably 400 $\mu$m or less.

When the restricting sheet is pressed and laminated onto the surface of the glass ceramics green sheet laminate, the wiring circuit layer made of the high-purity metal, particularly a metal foil, is preferably embedded completely in the surface or interface of the green sheet. This is because thickness of the high rigidity metal such as the metal foil is likely to generate a gap between the restricting sheet and the surface of the glass ceramics green sheet at the edges of the wiring circuit layer. Such a gap decreases the adhesion force of the restricting sheet with the glass ceramics green sheet at the portion. This makes the restricting force of the restricting sheet uneven near the region where the wiring circuit layer is formed, and therefore the edges of the wiring circuit layer may peel off when sintering.

In order to embed the wiring circuit layer, a pressure of 10 MPa or higher is preferably applied when transferring of the wiring pattern or laminating of the restricting sheet onto the surface of the green sheet. The wiring circuit layer comprising the metal foil can be embedded by this pressure.

The laminate is then heated in nitrogen atmosphere (preferably oxidizing or weakly oxidizing atmosphere) at a temperature within a range from 100 to 800° C., preferably within a range from 400 to 750° C. thereby to decompose and remove the organic component included in the green sheet or in the via hole conductive paste. Then, the laminate is sintered in an oxidizing atmosphere such as air or a non-oxidizing atmosphere such as N₂ at a temperature within a range from 800 to 1100° C., preferably within a range from 800 to 1000° C. Sintering temperature is set tone lower than the melting point of the high-purity metal conductor. When Ag is used for the wiring circuit layer conductor, sintering may be done in the air. When cooling rate after sintering is too high, cracks are likely to occur due to the difference in the thermal expansion coefficient between the insulating substrate and the wiring circuit layer. Therefore, cooling rate is preferably 400° C./hour or lower.

During sintering, a load may be applied by placing a weight, for example, on the laminate to prevent it from warping. The load is preferably in the range from 50 Pa to 1 MPa.

Then the restricting sheet (inorganic composite layer) that is not sintered is removed by such method as ultrasonic cleaning, polishing, water jet, chemical blast, sandblast wet blast (blast treatment by applying a jet of water including abrasive onto the surface to be processed) or the like. This completes the multi-layer wiring substrate that has the wiring circuit layer and the via hole conductors.

The restricting sheet acts so that the glass ceramics green sheet laminate shrinks only in the direction of thickness. As a result, shrinkage in the plane can be restricted to 0.5% or less when the ceramic wiring substrate is made by sintering the glass ceramics green sheet. Moreover, the glass ceramics green sheet is sintered uniformly over the entire surface and in a condition of surely bonded to the restricting sheet. Consequently, the restricting sheet never peels off and the glass ceramics green sheet laminate can be prevented from warping or deforming.

It is also made possible to prevent the glass component from diffusing into the restricting sheet from the surface of the glass ceramics green sheet. As a result, there occurs no insufficiency in sintering in the surface on the restricting sheet laminate side. Thus the ceramic wiring substrate having good surface property with voids occupying not greater than 5% of the surface thereof can be made.

The multi-layer wiring substrate thus obtained may be mounted on the external circuit board by, for example, attaching connection terminals such as solder balls to the connection pads formed on the back surface of the multi-layer wiring substrate. The solder balls are placed on the conductor layer of the external circuit board and heated to fuse. Thus the solder balls are fused with the conductor layer so that the wiring substrate is mounted on the surface of the external circuit board while being electrically connected therewith.

In the embodiment described above, the restricting sheet that is not sintered at the sintering temperature is used in order to control the constriction ratio of the green sheet laminate in the planar direction within 0.5%, although other constitution may be employed for a similar purpose. For example, a sintered body that has been made dense and does not experience substantial shrinkage any more may be laminated on one or both sides of the green sheet laminate, instead of the restricting sheet. Planar shrinkage can also be restricted by sintering the green sheet laminate while applying pressure thereon in the lamination direction.

Figure 2:
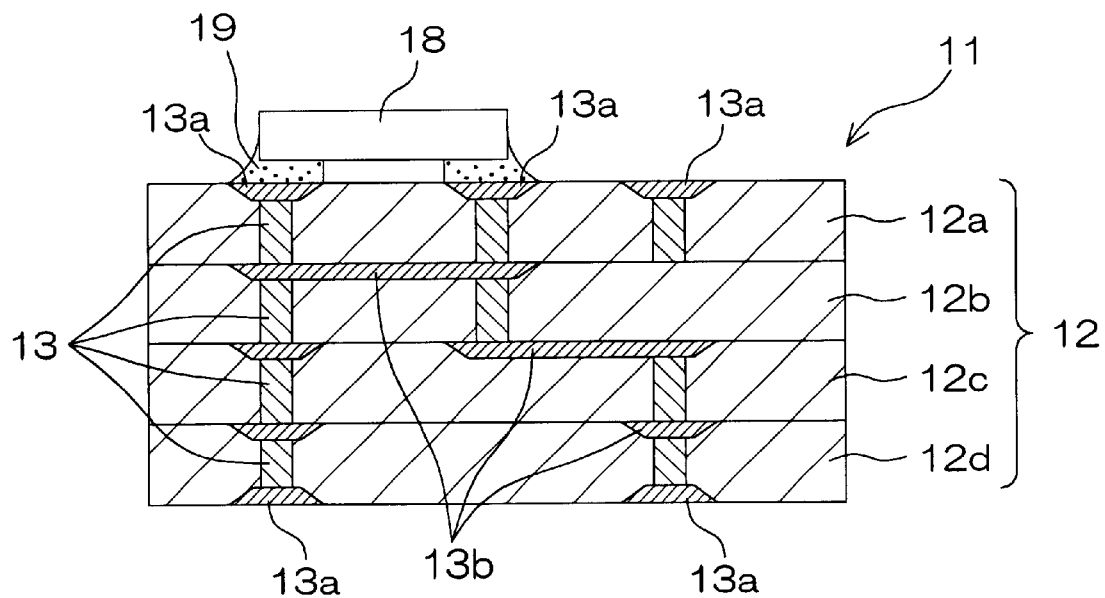
FIG. 2 is a schematic section-al view of a multi-layer wiring substrate according to the second embodiment of the present invention.
Figure 3:
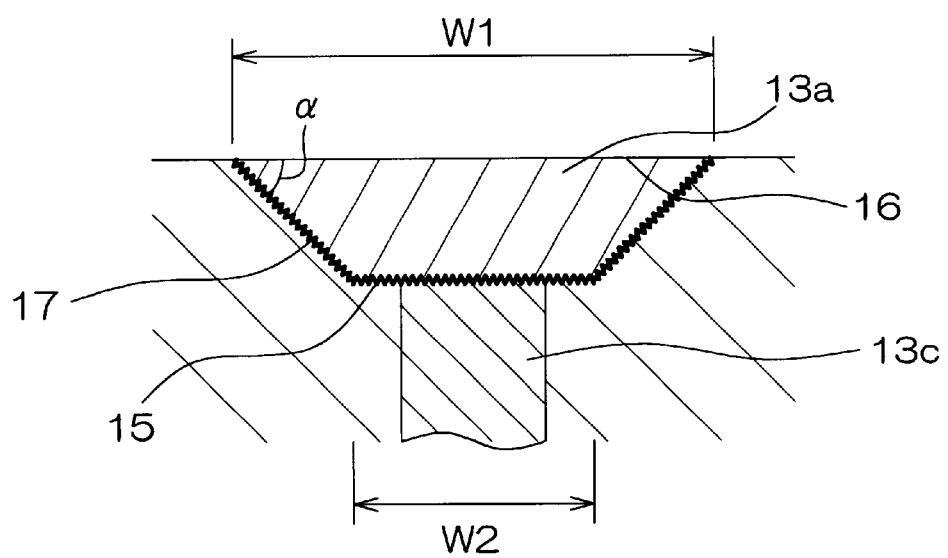
FIG. 3 is an enlarged cross sectional view of a part of the multi-layer wiring substrate of FIG. 2.

FIG. 2 is a schematic cross sectional view showing the configuration of the multi-layer wiring substrate according to the second embodiment of the present invention, and FIG. 3 is an enlarged sectional view of a part thereof.

A wiring substrate 11 of this embodiment comprises an insulating substrate 12 made by laminating a plurality of ceramic insulation layers 12a to 12d. Formed on the surface of the insulating substrate 12 and between the insulation layers 12a to 12d, respectively, are a surface wiring circuit layer 13a and internal wiring circuit layers 13b, which are made of high-purity dense metal conductor (preferably a metal foil) including a metal component in 99% by weight or higher, particularly 99.5% by weight or higher concentration. The surface wiring circuit layer 13a and the internal wiring circuit layer 13b are electrically connected to each other by means of via holes 13c that are filled with metal powder.

The surface wiring circuit layer 13a is embedded in the surface region of the insulating substrate 12, exposing only its top surface to outside. That is, the surface of the wiring circuit layer 13a is flash with the surface of the insulating substrate 12.

The surface wiring circuit layer 13a is formed to have a cross section of inverted trapezoidal shape in the direction perpendicular to the longitudinal direction (wiring direction) of the surface wiring circuit layer 13a,. That is, as shown in the enlarged sectional view of FIG. 3, width W1 of the bottom16 (longer one of parallel sides of the inverted trapezoid) of the surface wiring circuit layer 13a is made larger than width W2 of the top 15 (shorter one of parallel sides of the inverted trapezoid) of the surface wiring circuit layer 13a, while angle α made between the bottom 16 and the sloped side 17 (side connecting the corresponding end points of the parallel sides of the inverted trapezoid) is an acute angle.

By forming at least the surface wiring circuit layer 13a to have a cross section of inverted trapezoidal shape as described above, the lower side 15 (the side located at the deepest position from the surface of the insulating substrate 12) and the sloped side 17 of the inverted trapezoidal shape are bonded in close contact with the insulating substrate 12. At the same time, since the insulating substrate 12 around the wiring circuit layer 13a is less deformed, it can be embedded more favorably in the insulating substrate 12, thereby increasing the area of contact with the insulating substrate 12. This greatly improves the adhesion with the insulating substrate 12 of the surface wiring circuit layer 13a. Moreover, the surfaces of the surface wiring circuit layer 13a and the insulating substrate 12 can be made flush. Therefore, the present invention can also be applied to flip-chip mounting of semiconductor devices that requires high flatness of the wiring substrate.

In the cross sectional shape of the surface wiring circuit layer 13a, the angle a made between the sloped side 17 and the bottom 16 is required to be within a range from 45 to 80°, and preferably within a range from 50 to 75° in order to sufficiently achieve the effects described above. This is because it becomes difficult to embed in the insulating substrate 2 when the angle a is larger than 80°, thus decreasing the adhesive strength of the insulating substrate 2 and the surface wiring circuit layer 13a, and making the wiring circuit substrate surface less flat. When the angle a is less than 45°, edges of the wiring circuit layer becomes thinner thus decreasing the strength of the wiring circuit layer and making it likely to peel off from the edges.

Average surface roughness (Ra) of the surfaces that correspond to the lower side 15 and the sloped side 17 embedded in the insulating substrate 12a of the surface wiring circuit layer 13a is preferably 200 nm or higher, more preferably 400 nm or higher. The adhesion between the insulating substrate 12 and the surface wiring circuit layer 13a can be enhanced furthermore.

In the multi-layer wiring substrate of this embodiment, not only the surface wiring circuit layer 13a but also the internal wiring circuit layers 13b have cross section of inverted trapezoidal shape. That is, the internal wiring circuit layers 13b are embedded in the surfaces of the insulation layers 12b to 12d, while the surfaces of the insulation layers and the surfaces of the internal wiring circuit layers 13b are made flush with each other. This makes it possible to prevent the wiring substrate surface from undulating due to the thickness of the internal wiring circuit layer 13b, thereby to make the multi-layer wiring substrate of high flatness.

Also it is made possible to improve the close contact between the via hole conductors 13c, the surface wiring circuit layer 13a and the internal wiring circuit layers 13b. This improves the reliability of the circuit formed by connecting the surface wiring circuit layer 13a and the internal wiring circuit layers 13b, and between the internal wiring circuit layers 13b with the via hole conductors 13c.

The surface wiring circuit layer 13a and the internal wiring circuit layers 13b of the multi-layer wiring substrate of this embodiment are preferably made of a high-purity electrically conductive material including metal in 99% by weight or higher content. In order to reduce the resistance of the wiring circuit layer, in particular, the wiring circuit layers are preferably made of a material including at least one kind of low-resistance conductive material selected from among Cu, Ag, Al, Au, Ni, Pt and Pd as the principal component. It is particularly preferable that at least one kind selected from among cu, Ag and Au is included as the principal component.

The surface wiring circuit layer 13a and the internal wiring circuit layers 13b are preferably made of metal foils. The metal foil being too thick makes it difficult to be embedded in the insulating substrate 12, and being too thin decreases the adhesive strength between the wiring circuit layers 13a, 13b and the insulating substrate 12. Thus, thickness of the surface wiring circuit layer 13a and the internal wiring circuit layers 13b is preferably within a range from 1 to 100 $\mu$m, preferrably from 2 to 50 $\mu$m, and more preferably from 4 to 20 $\mu$m.

It is desirable that the conductive material that forms the via hole conductors 13c consists of a metal similar to that of the surface wiring circuit layer 13a, and the internal wiring circuit layers 13b, although it is not restricted to the components described above.

The surface wiring circuit layer 13a of the wiring substrate 11 is used as an electrode pad for mounting the electronic component 18 such as an IC chip, as a shielding conductor layer, or further as a terminal electrode for connection with an external circuit such as one on a mother board. The electronic component 18 is connected to the surface wiring circuit layer 13a by means of an electrically conductive adhesive 19 such as solder. The wiring substrate may also have thick film resistor made of such a material as tantalum silicide, molybdenum silicide or rhenium oxide, or a wiring protection film made of glass, epoxy resin, etc. formed on the front surface thereof as required.

Constitution of the insulating substrate 12 is similar to that of the insulating substrate 2 of the first embodiment. Material to make the insulating substrate 12 is required to be capable of being sintered at a temperature below the melting point of the metal that forms the surface wiring circuit layer 13a and the internal wiring circuit layer 13b. Such materials include glass powder, glass ceramics made by sintering a mixture of glass powder and ceramics powder and ceramics made by adding a sintering assisting agent to ceramics powder. When the wiring circuit layer is made of the low-resistance conductor described above, in particular, glass powder or glass ceramics made by sintering a mixture of glass powder and ceramics powder is most suitable. Examples of the glass include silica glass, soda lime glass, lead glass, lead-alkali silicate glass, borosilicate glass, alumino borosilicate glass, borosilicate zinc glass, alumino silicate glass and phosphate glass. Among these, borosilicate glass is particularly preferable.

Examples of the ceramics powder include $SiO_2$, $Al_2O_3$, $ZrO_2$, $TiO_2$, $ZnO$, $MgAl_2O_4$, $ZnAl_2O_4$, $MgSiO_3$, $MgSiO_4$, $Zn_2SiO_4$, $Zn_2TiO_4$, $SrTiO_3$, $CaTiO_3$, $MgTiO_3$, $BaTiO_3$, $CaMgSi_2O_6$, $SrAl_2Si_2O_8$, $BaAl_2Si_2O_8$, $CaAl_2Si_2O_8$, $Mg_2Al_4Si_5O18$, $Zn_2Al_4Si_5O_{18}$, AlN, SiC, mullite and zeolite. These ceramics powders may be selected in accordance with the type of the wiring circuit layer.

The insulating substrate 12 has thermal expansion coefficient preferably 6 ppm/° C. or higher in a temperature range from 40 to 400° C. This is for the purpose of improving the reliability when mounting the ceramic wiring substrate of the present invention on a mother board or the like comprising a circuit board made of an organic material having thermal expansion coefficient of about 15 to 30 ppm/° C. When the thermal expansion coefficient is lower than 6 ppm/° C., thermal stress due to difference in the thermal expansion coefficient increases when the wiring substrate is mounted on the mother board, thus being likely to spoil the long-term stability of the mounting structure. Thermal expansion coefficient of the insulating substrate 12 is more preferably 8 ppm/° C. or higher, and most preferably 10 ppm/° C. or higher. In order to achieve such a high thermal expansion coefficient, the insulating substrate preferably includes $SiO_2$-based crystal such as quartz, cristobalite or tridymite.

A method of producing the multi-layer wiring substrate of this embodiment will be described below with reference to FIGS. 4A, 4B, 5A to 5D, 6A and 6B.

Figure 4A:
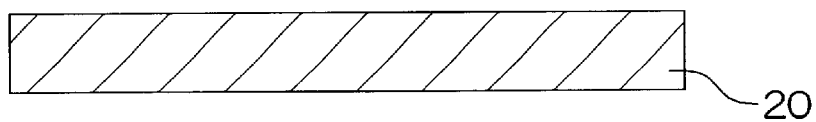
FIGS. 4A and 4B are cross sectional views showing the step of making a green sheet and the step of forming a via hole conductor.

(1) First, ceramics powders described above are mixed in the predetermined proportions, with an organic binder or the like added to the mixture, and a green sheet is made by forming the mixture into a sheet shape by a doctor blade process, rolling, pressing or other process (FIG. 4A).

Figure 4B:
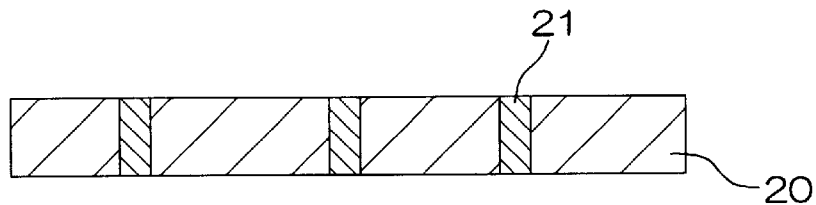

(2) Then through holes are made in the green sheet by laser, micro drilling, punching, or the like, and the holes are filled with an electrically conductive paste thereby to form via hole conductors 21 (FIG. 4B). The conductive paste includes the metal powder for forming the wiring circuit layer as described above, the organic binder and the organic solvent, and may also include an inorganic additive such as glass as required.

Figure 5A:
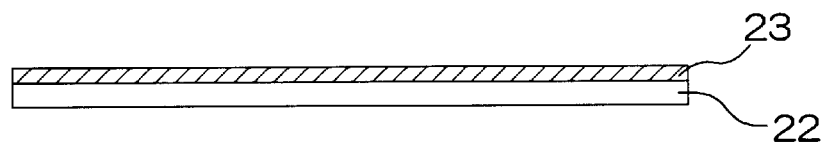
FIGS. 5A to 5D are cross sectional views showing the step of forming the wiring circuit layer of trapezoidal cross section on a transfer sheet.
Figure 5B:
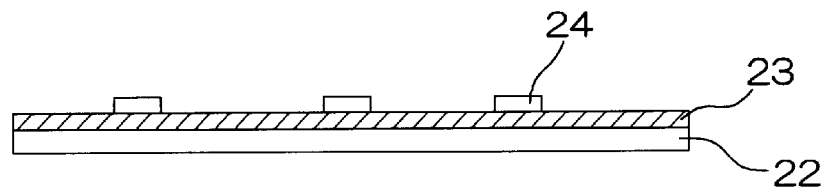
Figure 5C:
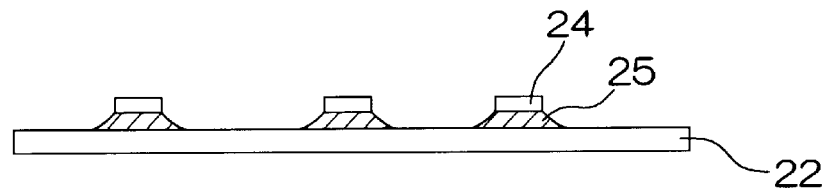

Then the surface wiring circuit layer 13a is formed on the surface of the green sheet 20 in the subsequent steps (3a) to (3c) (FIG. 5A to 5C).

(3a) A flexible transfer film 22 such as a resin film with a high-purity metal conductor layer 23 including metal content in 99% by weight or more attached thereto with an adhesive is prepared (FIG. 5A). The high-purity metal conductor layer 23 including metal content in 99% by weight or more preferably consists of a metal foil that includes at least one kind selected from among Cu, Ag, Al, Au, Ni, Pt and Pd as the principal component.

According to this method, since fine wiring can be made without breakage or loosening, fine wiring can be formed precisely with width of wiring line within 50 $\mu$m and spacing between wiring lines within 50 $\mu$m.

(3b) Then a resist pattern 24 having a circuit pattern is formed on the surface of the high-purity metal conductor layer 23 (FIG. SB).

(3c) Then the high-purity metal conductor layer 23 is removed by etching from a region where the resist layer 24 is not formed, thereby to form a wiring circuit layer (FIG. 5C). At this time, etching is done so that the wiring circuit layer 25 has a cross section of trapezoidal shape in the direction perpendicular to the wiring direction and the angle made between the bottom and the sloped side of the trapezoid is within a range from 45 to 80°. Such a trapezoidal shape maybe formed by setting the etching rate within a range from 2 to 50 μm/min. When the etching rate is faster than 50 μm/min, cross section of the wiring circuit layer becomes substantially rectangular and, when the etching rate is slower than 2 μm/min, the angle becomes less than 45°. In this embodiment, the wiring circuit layer 25 having the cross section of trapezoidal shape as described above can be formed by controlling the etching period in accordance with the thickness of the high-purity metal conductor layer 23 at this etching rate.

Figure 5D:
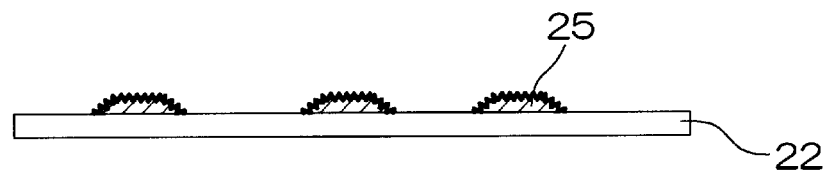

(3d) Average surface roughness of the surfaces that correspond to the top and the sloped side of the wiring circuit layer 25 is preferably 200 nm or higher, more preferably 400 nm or higher by surface roughening (FIG. 5D). Surface roughening is carried out by treating the wiring circuit layer 25 with formic acid or a mixture solution of $NaClO_2$, NaOH and $Na_3PO_4$. The surface roughness can be controlled by the rate of roughening, and satisfactory roughening can be achieved with a roughening rate of 1 μm/min or higher.

Figure 6A:
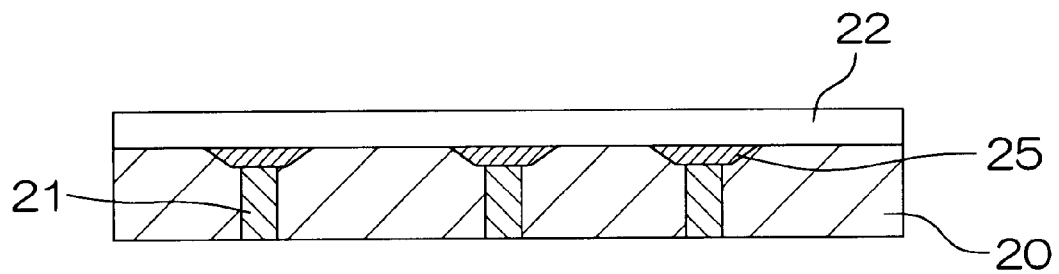
FIGS. 6A and 6B are cross sectional views showing the step of transferring the wiring circuit layer from the transfer sheet onto a green sheet and laminating a plurality of green sheets.
Figure 6B:
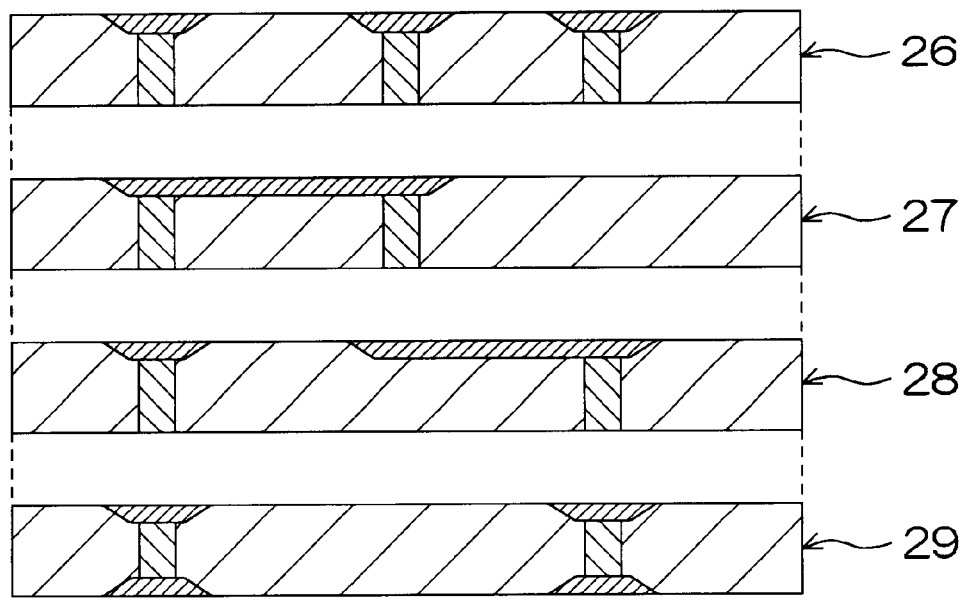

(4) The transfer film 22 carrying the wiring circuit layer 25 as described above is positioned on the surface of the green sheet 20 prepared in the step (2) and laminated, while applying a pressure of about 10 to 500 μg/cm² (FIG. 6A). In this step, the wiring circuit layer 25 which has a cross section of inverted trapezoidal shape is embedded in the green sheet 20 so that the bottom of the inverted trapezoidal cross section of the wiring circuit layer 25 becomes flush with the surface of the green sheet 20. Then while leaving the wiring circuit layer 25 remaining in the green sheet 20, the transfer film 22 is peeled off together with the adhesive (not shown), so that the wiring circuit layer 25 is transferred onto the surface of the green sheet 20, thereby making one layer of transfer sheet 26.

(5) Then the wiring sheets 27 to 29 made through substantially the same process as the steps (1) to (4) are laminated with the wiring sheet 26 under pressure, thereby to make the green sheet laminate.

(6) The laminate is heated in nitrogen atmosphere at a temperature within a range from 400 to 800° C., thereby to decompose and remove organic components included in the green sheet and in the via hole conductive paste. This laminate is then fired at a temperature lower than the melting point of the high-purity metal conductor that forms the wiring circuit layer, thereby to make the multi-layer wiring substrate shown in FIG. 2.

The firing is conducted in a nitrogen atmosphere at a temperature within a range from 800 to 1000° C. when the wiring circuit layer 25 is made of a copper foil. During the firing process, the wiring circuit layer 25 made of a high-purity metal conductor does not shrink unlike the green sheet. On firing, the low-sinterable restricting sheet described in the first embodiment or the restricting sheet made of ceramics which has been made dense and hardly shrinks is preferably laminated on the green sheet, followed by firing while restricting the planar shrinkage. To restrict the planar shrinkage, a pressure may be applied to the laminate in one direction thereby restricting the planar shrinkage during firing.

The multi-layer wiring substrate can be made in the steps (1) to (6) described above. The wiring substrate of a single wiring circuit layer can be produced by the steps (1) (3a to 3d) and (4) and firing as shown in the step (6) thereafter. The wiring substrate of two wiring circuit layer can be produced by the steps (1) to (3), step (4), formation of the wiring circuit layers 25 on both sides of the green sheet 20, and then firing the laminate as in the step (6).

Figure 7A:
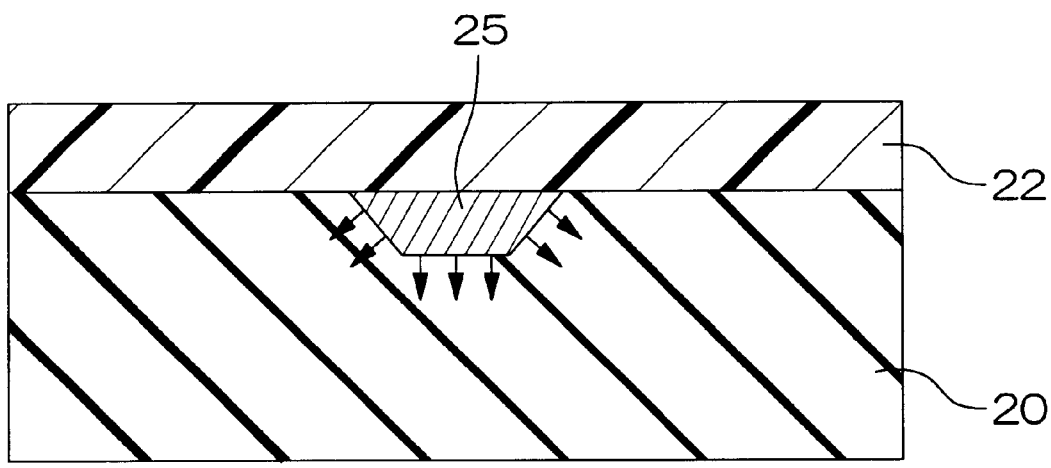
FIG. 7A is a cross sectional view of a green sheet having the wiring circuit layer of inverted trapezoidal cross section.
Figure 7B:
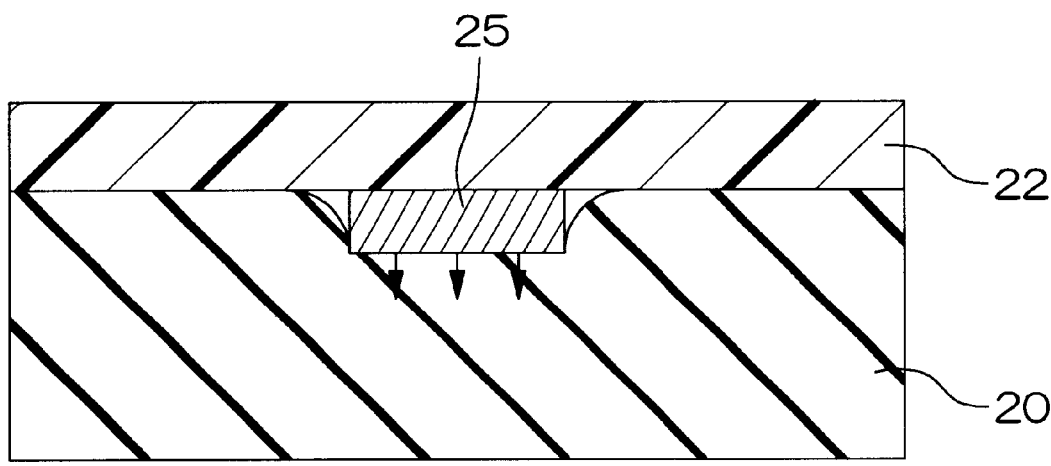
FIG. 7B is a cross sectional view of a green sheet having the wiring circuit layer of rectangular cross section.

According to the production process described above, the wiring circuit layer 25 after transferred on the surface of the green sheet 20 in the step (4) is made to have a cross section of inverted trapezoidal shape. With this configuration, as shown in FIG. 7A, deformation of the green sheet 20 around the wiring circuit layer 25 is surpressed when the wiring circuit layer 25 is pressure-bonded onto the surface of the green sheet 20. The pressure is applied to the green sheet 20 from the side and top of the inverted trapezoidal cross section of the wiring circuit layer 25. As a result, the wiring circuit layer 25 can be embedded in the green sheet 20 more favorably than the case where cross section of the wiring circuit layer 25 is substantially rectangular (FIG. 7B). At the same time, adhesion performance of the wiring circuit layer 25 onto the insulating substrate after firing can be greatly improved.

Features of the second embodiment are preferably combined with the features described in conjunction with the first embodiment.

EXAMPLES

Example 1-1

The glass ceramic wiring substrate according to the above first embodiment was evaluated based on Example.

As shown in Table 1-1, several kinds of glass and $Al_2O_3$, forsterite and $SiO_2$ as the ceramic component were weighed to adjust Young's modulus, and then glass ceramics 1-A to 1-H were made. An acrylic resin as a binder, DBP (dibutyl phthalate) as a plasticizer, and toluene and isopropyl alcohol as a solvent were added thereto to prepare a slurry. Using this slurry, a green sheet having a thickness of 500 μm was made by a doctor blade process.

First, the respective green sheets were laminated and fired at 900° C. to make specimens of 3 mm×4 mm×40 mm in size for JIS transverse test to measure Young's modulus. The specific gravity of the specimens were measured by Archimedes's method. Then, the surface of the specimens were subjected to mirror grinding. The Young's modulus of each specimen was determined based on the results of an ultrasonic pulse method (according to JISR 1602-1995) and the measurement of the specific gravity. The results are shown in Table 1-1.

TABLE 1-1

| Materials | Glasses (% by weight) | % by weight | Ceramic component (% by weight) | Young's modulus (GPa) | Thermal expansion coefficient (ppm/° C.) |
|---|---|---|---|---|---|
| 1-A | $SiO_2(74)$—$Li_2O(14)$—$Al_2O_3(4)$—$K_2O(2)$—$P_2O_5(2)$—$Na_2O(2)$—$ZnO(2)$ | 20 | $Al_2O_3(80)$ | 260 | 7.5 |
| 1-B | $SiO_2(74)$—$Li_2O(14)$—$Al_2O_3(4)$—$K_2O(2)$—$P_2O_5(2)$—$Na_2O(2)$—$ZnO(2)$ | 50 | $Al_2O_3(50)$ | 170 | 10.9 |
| 1-C | $SiO_2(74)$—$Li_2O(14)$—$Al_2O_3(4)$—$K_2O(2)$—$P_2O_5(2)$—$Na_2O(2)$—$ZnO(2)$ | 60 | $Al_2O_3(40)$ | 130 | 11.1 |

TABLE 1-1-continued

| Materials | Glasses (% by weight) | % by weight | Ceramic component (% by weight) | Young's modulus (GPa) | Thermal expansion coefficient (ppm/° C.) |
|---|---|---|---|---|---|
| 1-D | SiO$_2$(74)—Li$_2$O(14)—Al$_2$O$_3$(4)—K$_2$O(2)—P$_2$O$_5$(2)—Na$_2$O(2)—ZnO(2) | 65 | Al$_2$O$_3$(35) | 120 | 11.2 |
| 1-E | SiO$_2$(78)—Li$_2$O(10)—Al$_2$O$_3$(4)—K$_2$O(4)—P$_2$O$_5$(2)—Na$_2$O(2) | 35 | Forsterite(30) SiO$_2$(35) | 114 | 14.6 |
| 1-F | SiO$_2$(74)—Li$_2$O(14)—Al$_2$O$_3$(4)—K$_2$O(2)—P$_2$O$_5$(2)—Na$_2$O(2)—ZnO(2) | 70 | Al$_2$O$_3$(30) | 110 | 12.5 |
| 1-G | SiO$_2$(78)—Li$_2$O(10)—Al$_2$O$_3$(4)—K$_2$O(4)—P$_2$O$_5$(2)—Na$_2$O(2) | 50 | Forsterite(50) | 108 | 11.7 |
| 1-H | SiO$_2$(45)—Al$_2$O$_3$(6)—B$_2$O$_3$(9)—CaO(5)—BaO(35) | 50 | SiO$_2$(50) | 80 | 12.2 |

An acrylic resin as an organic binder and DBP as a solvent were added to Cu powder having an average particle diameter of 5 µm and the mixture was kneaded to prepare a paste sample for via hole conductor. The organic binder in the paste sample for via holes was added in the amount of 2.0 parts by weight with respect to 100 parts by weight of the Cu powder and, furthermore, the solvent was added in the amount of 75 parts by weight with respect to 100 parts by weight of the Cu powder and organic binder.

Via holes were formed at predetermined positions on the green sheet and via holes were filled with the Cu paste thus prepared.

A Cu foil having a purity of 99.9% or more and a thickness of 15 µm was bonded to a transfer film made of PET and a resist of a mirror image of the wiring pattern was coated, followed by etching treatment and further removal of the resist to form a wiring circuit layer of the mirror image. The wiring width was adjusted to 0.05 mm. A very fine wiring circuit layer could be formed as compared with a conventional screen printing method because it was formed by etching. The cross section of the wiring circuit layer had a trapezoid shape having an angle of 60° made between the bottom and slope side of the trapezoid.

The transfer film was laminated on the green sheet provided with via holes while positioning the via holes, followed by contact bonding with heating at 60° C. under a pressure of 150 kgf/cm$^2$. As a result, the surface of the wiring circuit pattern and that of the insulating sheet were flush. The transfer film was peeled off to form a unit of a green sheet having a wiring circuit layer connected with a via hole conductor.

Five green sheets made in the same manner were laminated and contact-bonded. Using Al$_2$O$_3$ containing 5% by volume of glass shown in Table 1-1 in each green sheet as non-sintered inorganic composition, green sheets (restricting sheet) were made by the same manner as that of the glass ceramic green sheet. The resulting restricting sheets were laminated on both surfaces of the glass ceramic laminate at 60° C. under a pressure of 200 kgf/cm$^2$.

Then, the non-fired laminate was fired at 700° C. in a nitrogen atmosphere to decompose and remove organic components such as organic binder. Thereafter, firing was carried out at 900° C. in a nitrogen atmosphere. The restricting sheet was removed by a blast treatment to make a wiring substrate.

Using a scanning electron microscope (SEM), it was confirmed whether or not cracks occurred on the surface of the resulting wiring substrate. Samples with no cracks were rated good.

Using the resulting wiring substrate, the conduction resistance of the wiring circuit layer was evaluated. On evaluation, a copper wiring circuit layer having a width of 0.05 mm and a length of 20 mm was previously formed and the wiring resistance of the copper wiring circuit layer was measured by using a tester. The cross section area of the copper wiring circuit layer was determined by using a scanning electron microscope (SEM) and the length of the copper wiring circuit layer was determined by using a microscope with a magnification of 40. The resistivity was calculated from the resulting area and length. Samples having a resistivity of not more than 2.5 µΩ·cm were rated good.

On evaluation of the reliability of connection, connection terminals made of solder (comprising 10 to 60% of tin and 40 to 90% of lead) were mounted to connection pads. The connection terminals were formed on the entire bottom surface of the wiring substrate in a density of 30 terminals per 1 cm$^2$. On the other hand, a printed circuit board provided with a wiring conductor made of a glass-epoxy substrate was prepared, followed by positioning of the wiring substrate and the wiring conductor on the printed circuit board so as to connect each connection terminal. The resultant was heat-treated at 260° C. in a N$_2$ atmosphere for three minutes and the glass ceramic wiring substrate was mounted on the surface of the printed circuit board. It was confirmed that the connection terminals made of solder of the wiring substrate were molten by the heat treatment to connect electrically to the wiring conductor of the printed circuit board.

A heat loading test was carried out with respect to those wherein the glass ceramic wiring substrate was mounted on the surface of the printed circuit board. Test samples were maintained in turn in constant temperature bathes controlled to temperatures of −40° C. and 125° C., respectively, in an air for each 15 minutes. Using this process as one cycle, 1000 cycles of heat loading was applied to the test samples. The electrical resistance between the wiring conductor of the printed circuit board and the glass ceramic wiring substrate was measured every cycle. The numbers of cycles until a change in the electrical resistance appears are shown in Table 1-2. Samples where the number of cycles exceeds 500 were rated good.

Examples 1-2, 1-3 and 1-4

In the same manner as that in Example 1-1, except for using each of metal foils made of Ag having a purity of 99.9% or more, Ag—Pd and Ag—Pt as a high purity metal conductor constituting the wiring circuit layer, multi-layer wiring substrates were made, respectively. In all Examples, firing was carried out at 900° C. in an air. The evaluation results are shown in Table 1-2.

Examples 1-5, 1-6 and 1-7

In the same manner as in Example 1-1, except for using each of green sheets of $SiO_2$, $ZrO_2$ and MgO as a non-sintered inorganic composition, multi-layer wiring substrates were made, respectively. The evaluation results are shown in Table 1-2.

Comparative Example 1

In the same manner as in Example 1-1, except for using a screen printing process with a copper paste in place of transfer of a metal foil, a wiring circuit layer was formed. The evaluation results are shown in Table 1-2.

the occurrence of cracks after firing could be suppressed even when using a metal foil. Particularly, the occurrence of cracks could be completely prevented by controlling Young's modulus to 100 GPa or less. The multi-layer wiring substrate of the present invention was also superior in reliability of connection to the printed circuit board.

Example 2

First, each filler shown in Table 2-2a was added to each of glasses 2-A to 2-D shown in Table 2-1, and then an acrylic resin as a binder, DBP (dibutylphthalate) as a plasticizer, and toluene and isopropyl alcohol as a solvent were added to prepare a slurry. Using the slurry, a green sheet having a thickness of 500 μm was made by a doctor blade process.

TABLE 1-2

| No. | Materials | Non-sintered material | Young's modulus (GPa) | Conductor materials | Conductor forming method | Resistivity (μΩ · cm) | Occurrence of cracks | Temperature cycle |
| --- | --- | --- | --- | --- | --- | --- | --- | --- |
| ✗1 | 1-A | $Al_2O_3$ | 260 | Cu | Foil transfer | 1.9 | Yes | 300 |
| ✗2 | 1-B | $Al_2O_3$ | 170 | Cu | Foil transfer | 2.0 | Yes | 400 |
| ✗3 | 1-C | $Al_2O_3$ | 130 | Cu | Foil transfer | 2.0 | Yes | 450 |
| 4 | 1-D | $Al_2O_3$ | 120 | Cu | Foil transfer | 2.0 | No | 700 |
| 5 | 1-F | $Al_2O_3$ | 114 | Cu | Foil transfer | 1.9 | No | 800 |
| 6 | 1-F | $Al_2O_3$ | 110 | Cu | Foil transfer | 2.0 | No | 900 |
| 7 | 1-G | $Al_2O_3$ | 108 | Cu | Foil transfer | 2.0 | No | >1000 |
| 8 | 1-H | $Al_2O_3$ | 80 | Cu | Foil transfer | 1.9 | No | >1000 |
| 9 | 1-G | $Al_2O_3$ | 108 | Ag | Foil transfer | 1.8 | No | >1000 |
| 10 | 1-G | $Al_2O_3$ | 108 | Ag/Pd | Foil transfer | 2.1 | No | >1000 |
| 11 | 1-G | $Al_2O_3$ | 108 | Ag/Pt | Foil transfer | 2.2 | No | >1000 |
| 12 | 1-G | $SiO_2$ | 108 | Cu | Foil transfer | 2.0 | No | >1000 |
| 13 | 1-G | $ZrO_2$ | 108 | Cu | Foil transfer | 2.0 | No | >1000 |
| 14 | 1-G | MgO | 108 | Cu | Foil transfer | 1.9 | No | >1000 |
| ✗15 | 1-G | $Al_2O_3$ | 108 | Cu | Paste printing | Wire breakage | No | >1000 |

The symbol ✗ represents a sample that is not rated good.

As is apparent from Table 1-2, regarding the sample numbers 1, 2 and 3 wherein Young's modulus of the insulating substrate material exceeds 120 GPa, many cracks occurred on the surface of the wiring substrate after removing the non-sintered inorganic composition. Moreover, a change in resistance appeared after 500 cycles or less in the temperature cycle test. In the sample number 15 wherein the wiring circuit layer was formed by the screen printing process, wire breakage occurred and a fine wiring having a wiring width of 0.05 mm could not be formed.

In contrast with these Comparative Examples, according to the multi-layer wiring substrate of the present invention,

TABLE 2-1

| Glasses | Materials | Types | Deformation point |
| --- | --- | --- | --- |
| 2-A | Borosilicate glass | Crystal | 785° C. |
| 2-B | Lithium silicate glass | Crystal | 541° C. |
| 2-C | Almino borosilicate glass | Amorphous | 821° C. |
| 2-D | Borosilicate zinc glass | Amorphous | 720° C. |

On the other hand, 2.0 by weight of an acrylic resin, 0.5% by weight of alumina as a filler, DBP and acetone were added to material powders which have an average particle diameter of 5 μm and are made of the same metal as that constituting a wiring circuit layer shown in Table 2-2a, and then the mixture was kneaded by three rolls to prepare a paste for via hole conductor.

Via holes having a diameter of 100 μm were formed at predetermined positions of the green sheet by means of laser or punching. The via holes were filled with the paste for via hole conductor by a screen printing process.

Then, a metal foil which has a high purity of 99.8% and is composed of the components shown in Table 2-2a was bonded to the surface of a transfer film made of PET, followed by formation of a photosensitive resist, exposure, development, etching treatment and removal of the resist to form plural wiring circuit patterns having the wiring width shown in Table 2-2a and the same wiring interval as that of the wiring width. The cross section of the wiring circuit layer had a trapezoid shape having an angle of 60° made between the bottom and the slope side of the trapezoid.

The transfer film was laminated on the green sheet provided with the via hole conductor while positioning, followed by contact bonding with heating at 60° C. under a pressure of 200 kgf/cm². As a result, the surface of the wiring circuit pattern and that of the insulating sheet were flush. Then, a unit of a wiring sheet having a wiring circuit pattern connected to the via hole conductor was formed by peeling off only the transfer film. Furthermore, six units of wiring sheets were laminated to form a green sheet laminate.

Then, the laminate was heat-treated at 750° C. for one hour in a nitrogen atmosphere (Cu type) or an air (Ag type) to decompose and remove organic components such as organic binder, followed by uniaxial-pressure firing from the laminate direction at 900° C. under 200 kgf/cm² in an air (Ag type) or a nitrogen atmosphere (Cu type) for one hour to make a multi-layer wiring substrate.

With respect to the resulting multi-layer wiring substrate, it was confirmed by using a microscope whether or not cracks occurred in the insulating substrate and the wiring circuit layer. In addition, the conduction resistance of the wiring circuit layer was evaluated. Specifically, the cross section shape of the wiring circuit layer was observed by using a scanning electron microscope (SEM). The length of the wiring was determined by using a microscope. The wiring resistance was determined by using a tester and the resistivity was calculated.

Tape-shaped test pieces of 4 mm×10 mm in size were made through the above steps and the thermal expansion coefficient between the insulating layer and the conductor circuit layer was evaluated. The results are shown in Tables 2-2a and 2-2b.

Furthermore, connection terminals made of solder balls (comprising 10 to 60% of tin and 40 to 90% of lead) were attached to the connection pads formed on the back surface of the resulting wiring substrate. The connection terminals were formed on the entire bottom surface of the wiring substrate in a density of 30 terminals per 1 cm². On the other hand, a mother board provided with a wiring conductor made of a glass epoxy insulating substrate (thermal expansion coefficient of 18 ppm/° C.) was prepared, and then the wiring substrate was positioned to connect the wiring conductor on the mother board to each connection terminal. The multi-layer wiring substrate was mounted on the surface of the mother board by subjecting to a heat treatment at 260° C. for three minutes in an $N_2$ atmosphere.

Test samples of the resulting mounted article were maintained in turn in constant temperature bathes controlled to temperatures of −40° C. and 125° C. respectively, in an air for each 15 minutes. Using this process as one cycle, a thermal loading test was conducted. Heat loading was repeated 1000 cycles at most to apply heat loading to the test samples. The electrical resistance between the wiring conductor of the printed circuit board and the glass ceramic wiring substrate was measured every cycle. The numbers of cycles until the electrical resistance changes are shown in Table 2-2b.

As a Comparative Example, samples were made by a screen printing process of a paste in place of transfer of a metal foil as the method of forming the wiring conductor layer. 0.5% by weight of alumina as a filler, 2% by weight of an acrylic resin, DBP and acetone were added to Cu powders having an average particle diameter of 5 μm, and the mixture was kneaded by three rolls to prepare a paste. Using this paste, a wiring pattern having the wiring width shown in Table 2-2a was printed by a screen printing process. The wiring substrate was made and evaluated in the same manner as in Example 2 with the above exceptions. The results are shown in Tables 2-2a and 2-2b (sample numbers 15 and 16).

TABLE 2-2a

| Sample No. | Insulating layer | | | | | Wiring circuit layer | | | |
|---|---|---|---|---|---|---|---|---|---|
| | | | | | | | Metal | Wiring | |
| | Glass | % by weight | Filler | % by weight | $\alpha^{1)}$ | Types | content (%) | width (mm) | $\alpha^{1)}$ |
| 1 | 2-A | 60 | Quartz | 40 | 11.0 | Cu foil | 99.8 | 0.05 | 20.3 |
| 2 | 2-A | 70 | Quartz | 30 | 10.0 | Cu foil | 99.8 | 0.05 | 20.3 |
| 3 | 2-A | 80 | Quartz | 20 | 8.5 | Cu foil | 99.8 | 0.05 | 20.3 |
| 4 | 2-A | 90 | Quartz | 10 | 7.0 | Cu foil | 99.8 | 0.05 | 20.3 |
| *5 | 2-A | 95 | Quartz | 5 | 5.5 | Cu foil | 99.8 | 0.05 | 20.3 |
| *6 | 2-A | 100 | — | | 4.0 | Cu foil | 99.8 | 0.05 | 20.3 |
| 7 | 2-B | 50 | Quartz | 50 | 13.0 | Cu foil | 99.8 | 0.05 | 20.3 |
| 8 | 2-B | 55 | Quartz | 45 | 12.0 | Cu foil | 99.8 | 0.05 | 20.3 |
| 9 | 2-A | 70 | Quartz | 30 | 10.0 | Cu foil | 99.8 | 0.04 | 20.3 |
| 10 | 2-A | 70 | Quartz | 30 | 10.0 | Cu foil | 99.8 | 0.03 | 20.3 |
| 11 | 2-A | 70 | Quartz | 30 | 10.0 | Ag foil | 99.8 | 0.05 | 22.4 |
| *12 | 2-A | 70 | Alumina | 30 | 5.0 | Cu foil | 99.8 | 0.05 | 20.3 |
| *13 | 2-C | 70 | Quartz | 30 | 5.0 | Cu foil | 99.8 | 0.05 | 20.3 |
| *14 | 2-D | 70 | Quartz | 30 | 5.5 | Cu foil | 99.8 | 0.2 | 20.3 |

TABLE 2-2a-continued

| | Insulating layer | | | | | Wiring circuit layer | | | |
|---|---|---|---|---|---|---|---|---|---|
| | | | | | | | Metal | Wiring | |
| Sample No. | Glass | % by weight | Filler | % by weight | $\alpha^{1)}$ | Types | content (%) | width (mm) | $\alpha^{1)}$ |
| *15 | 2-A | 70 | Quartz | 30 | 10.0 | Cu paste | 97.0 | 0.05 | 19.7 |
| *16 | 2-A | 70 | Quartz | 30 | 10.0 | Cu paste | 97.0 | 0.2 | 19.7 |

The symbol * represents a sample that is not rated good.
[1)] $\alpha$: Average thermal expansion coefficient at 25 to 800° C.
[2)] $\Delta\alpha$: maximum difference in thermal expansion coefficient at 25 to 800° C.

TABLE 2-2b

| Sample No. | $\Delta\alpha^{2)}$ | Occurrence of cracks | Resistivity ($\mu\Omega \cdot$ cm) | Heat cycle test (cycles) |
|---|---|---|---|---|
| 1 | 9.5 | No | 1.9 | >1000 |
| 2 | 10.6 | No | 2.0 | >1000 |
| 3 | 11.9 | No | 2.0 | 800 |
| 4 | 13.5 | No | 1.9 | 600 |
| *5 | 14.9 | Yes | 2.0 | 300 |
| *6 | 16.5 | Yes | 1.9 | 100 |
| 7 | 7.3 | No | 2.0 | >1000 |
| 8 | 8.5 | No | 2.0 | >1000 |
| 9 | 10.4 | No | 2.0 | >1000 |
| 10 | 10.4 | No | 2.1 | >1000 |
| 11 | 12.6 | No | 1.8 | >1000 |
| *12 | 15.3 | Yes | 2.0 | 300 |
| *13 | 15.4 | Yes | 2.0 | 200 |
| *14 | 14.9 | Yes | 1.9 | 200 |
| *15 | 9.7 | No | ∞ (wire breakage) | >1000 |
| *16 | 9.7 | No | 3.5 | >1000 |

As is shown in Table 2-2, regarding the sample numbers 5, 6, 12 to 14 wherein a difference in thermal expansion coefficient between the insulating layer and the conductor wiring circuit layer at 25° C. to 800° C. is larger than 14 ppm/° C., cracks were observed in the vicinity of the conductor wiring circuit layer of the wiring substrate after firing. Also in the heat cycle test, defective connection occurred within 300 cycles. In the sample numbers 15 and 16 wherein a Cu paste is used and the content of the metal component is less than 99%, the resistivity of the wiring circuit layer was high and wire breakage occurred as a result of fine wiring.

On the other hand, in the samples according to the present invention (sample numbers 1 to 4, 7 to 11), cracks did not occurred and there sistivity of the wiring circuit layer was low as 2.1 $\mu\Omega$·cm or less. In the heat cycle test, the samples did not brake down within 500 cycles or more.

Example 3-1

As shown in Table 3-1, $SiO_2$–$B_2O_3$–$Al_2O_3$ series crystal glass or $SiO_2$–$B_2O_3$-BaO series amorphous glass, and $Al_2O_3$, $ZrO_2$ and $SiO_2$ as a ceramic filler component were weighed to adjust the content of the amorphous components after firing, and thus glass ceramic compositions 3-A to 3-F in Table 3-1 were made.

Acrylic resin as a binder, DBP (dibutyl phthalate) as a plasticizer, toluene and isopropyl alcohol as a solvent were added to these compositions to prepare a slurry. Using this slurry, a green sheet having a thickness of 500 $\mu$m was made by a doctor blade process.

To determine the glass content of the compositions in Table 3-1 after sintering, the above compositions were molded and fired at 900° C. to form specimens of 10 mm×10 mm×3 mm. The resulting specimens were ground by using a mortar and the glass content (crystallinity) was determined by a Rietvelt method. The measurement results are shown in Table 3-1.

TABLE 3-1

| Insulating materials | Glasses (% by weight) | Glass component % by volume | Ceramic component (% by volume) | Glass content in sintered body (% by volume) |
|---|---|---|---|---|
| 3-A | $SiO_2$(40)—$B_2O_3$(10)—$Al_2O_3$(28)—ZnO(11)—MgO(11) | 60 | $Al_2O_3$(10) $ZrO_2$(30) | 5 |
| 3-B | $SiO_2$(40)—$B_2O_3$(10)—$Al_2O_3$(28)—ZnO(11)—MgO(11) | 70 | $ZrO_2$(30) | 40 |
| 3-C | $SiO_2$(40)—$B_2O_3$(10)—$Al_2O_3$(28)—ZnO(11)—MgO(11) | 70 | $SiO_2$(30) | 44 |
| 3-D | $SiO_2$(45)—$Al_2O_3$(6)—$B_2O_3$(9)—CaO(5)—BaO(35) | 60 | $Al_2O_3$(40) | 55 |
| 3-E | $SiO_2$(45)—$Al_2O_3$(6)—$B_2O_3$(9)—CaO(5)—BaO(35) | 50 | $ZrO_2$(50) | 40 |
| 3-F | $SiO_2$(45)—$Al_2O_3$(6)—$B_2O_3$(9)—CaO(5)—BaO(35) | 50 | $SiO_2$(50) | 45 |

12 parts by weight of an acrylic resin, 6 parts by weight of a phthalate series plasticizer and 30 parts by weight of toluene as a solvent were added to 100 parts by weight of various glass ceramic compositions. The mixture was mixed by using a ball mil to prepare a slurry. This slurry was formed into a glass ceramic green sheet having a thickness of 300 $\mu$m by a doctor blade process.

Then, acrylic resin as an organic binder and dibutyl phthalate as a solvent were added to Cu powder having an average particle diameter of 5 $\mu$m, and then the mixture was kneaded to form a paste sample for via hole conductor in a paste form. The amount of the organic binder in the paste sample for via holes was 2.0 parts by weight based on 100 parts by weight of a principal component and the solvent was added in the amount of 75 parts by weight based on the solid component and organic binder. Via holes were formed at the predetermined positions of the green sheet and the via holes were filled with the Cu paste.

Then, a Cu foil having a purity of 99.9% or more was bonded on the surface of the polymer film, followed most preferably 10 ppm/° C. or higher. In order to achieve width was adjusted to 0.05 mm. A very fine wiring circuit layer could be formed as compared with a conventional screen printing process because it was formed by etching. The cross section of the wiring circuit layer had a trapezoid shape having an angle of 60° made between the bottom and the slope side of the trapezoid.

A transfer sheet was bonded on the green sheet provided with a via hole conductor while positioning of the via holes, followed by contact bonding with heating at 60° C. under a pressure of 15 MPa. Then, a unit of a wiring layer having a wiring circuit layer connected to a via hole conductor could be formed by peeling the transfer sheet.

Five wiring layers were formed in the same manner and these layers were laminated to form a glass ceramic green sheet laminate.

Then, the same glass as that of the glass component in the green sheet was added to alumina having a purity of 99.99% to make restricting sheets having a thickness of 250 μm, which are composed of various compositions shown in Table 3-2. An organic binder, a plasticizer and a solvent on formation of a sheet were the same as those of the green sheet for the wiring layers.

TABLE 3-2

| Materials | Restricting sheets | Amount of glass (% by volume) |
|---|---|---|
| 1 | $Al_2O_3$ | 0.1 |
| 2 | $Al_2O_3$ | 0.5 |
| 3 | $Al_2O_3$ | 1.0 |
| 4 | $Al_2O_3$ | 3.0 |
| 5 | $Al_2O_3$ | 5.0 |
| 6 | $Al_2O_3$ | 10.0 |
| 7 | $Al_2O_3$ | 15.0 |
| 8 | $Al_2O_3$ | 20.0 |
| 9 | $SiO_2$ | 3.0 |
| 10 | MgO | 3.0 |
| 11 | $ZrO_2$ | 3.0 |

The resulting restricting sheets were contact-bonded on both surfaces of the green sheet laminate 1 at 60° C. under a pressure of 20 MPa to obtain a laminate.

Then this laminate was placed in a $Al_2O_3$ setter and fired at 700° C. in a nitrogen atmosphere to decompose and remove organic components such as organic binder, followed by firing at 900° C. in a nitrogen atmosphere for one hour. The restricting sheets were then removed by a blast treatment to form a wiring substrate.

Appearance observation of the wiring substrate was carried out and it was confirmed whether or not deformation and adhesion occurred. Samples with no deformation or adhesion were rated good. The condition of the surface of the wiring substrate was observed with a scanning electron microphotograph and the proportion of the surface occupied by voids was determined by imaging analysis.

Using the resulting wiring substrate, the conduction resistance the wiring circuit layer was evaluated. On evaluation, a copper wiring circuit layer having a width of 0.05 mm and a length of 20 mm was prepared and the wiring resistance was measured by using a tester. The cross section area of the copper wiring circuit layer was determined by using a scanning electron microscope (SEM) and the length of the copper wiring was determined by using a microscope with a magnification of 40. The resistivity of the copper wiring circuit layer was calculated from the resulting area and length. Samples having the resistivity of 2.5 $\mu\Omega$·cm or less were rated good. The evaluation results are shown in Tables 3-3a and 3-3b.

Furthermore, the shrinkage percentage was calculated by measuring the outer side of the insulating substrate before firing using a micrometer and the outer side was measured after firing using the micrometer.

Examples 3-2, 3-3 and 3-4

In the same manner as in Example 3-1, except that the same substrate material as used in Example 3-1 was used and Ag, Ag/Pd and Ag/Pt were used as a conductor material, wiring substrates were made respectively. Firing was carried out at 900° C. in an air. The evaluation results are shown in Tables 3-3a and 3-3b.

Examples 3-5, 3-6 and 3-7

In the same manner as in Example 3-1, except for using $SiO_2$, MgO and $ZrO_2$ as the restricting sheet, wiring substrates were made and evaluated, respectively. The evaluation results are shown in Tables 3-3a and 3-3b.

Comparative Example 3

In the same manner as in Example 3-1, except for using a conventional screen printing process in place of a transfer of a metal foil as the method of forming the conductor, a wiring substrate was made. The wire breakage occurred because the wiring width was fine such as 0.05 mm. The evaluation results are shown in Tables 3-3a and 3-3b.

TABLE 3-3a

| No. | Insulating materials | Restricting sheet No. | Conductor materials | Wiring forming method | Resistivity ($\mu\Omega$·cm) | Shrinkage % | Occurrence of surface adhesion | Void area (%) |
|---|---|---|---|---|---|---|---|---|
| ✗1 | 3-A | 4 | Cu | Foil transfer | 1.9 | 5 | No | 7 |
| 2 | 3-B | 4 | Cu | Foil transfer | 2.0 | 0.5 | No | 3 |
| 3 | 3-C | 4 | Cu | Foil transfer | 2.0 | 0.3 | No | 3 |
| 4 | 3-D | 4 | Cu | Foil transfer | 1.9 | 0.1 | No | 2 |

TABLE 3-3a-continued

| No. | Insulating materials | Restricting sheet No. | Conductor materials | Wiring forming method | Resistivity ($\mu\Omega \cdot$ cm) | Shrinkage % | Occurrence of surface adhesion | Void area (%) |
|---|---|---|---|---|---|---|---|---|
| 5 | 3-E | 4 | Cu | Foil transfer | 2.0 | 0.1 | No | 3 |
| 6 | 3-F | 4 | Cu | Foil transfer | 2.0 | 0.1 | No | 3 |
| ✕7 | 3-C | 1 | Cu | Foil transfer | 1.9 | 4.0 | No | 6 |
| 8 | 3-C | 2 | Cu | Foil transfer | 2.0 | 0.4 | No | 3 |
| 9 | 3-C | 3 | Cu | Foil transfer | 2.1 | 0.2 | No | 2 |
| 10 | 3-C | 4 | Cu | Foil transfer | 2.2 | 0.1 | No | 2 |

TABLE 3-3b

| No. | Insulating materials | Restricting sheet No. | Conductor materials | Wiring forming method | Resistivity ($\mu\Omega \cdot$ cm) | Shrinkage % | Occurrence of surface adhesion | Void area (%) |
|---|---|---|---|---|---|---|---|---|
| 11 | 3-C | 5 | Cu | Foil transfer | 2.0 | 0.1 | No | 3 |
| 12 | 3-C | 6 | Cu | Foil transfer | 2.0 | 0.1 | No | 3 |
| 13 | 3-C | 7 | Cu | Foil transfer | 1.9 | 0.1 | No | 2 |
| ✕14 | 3-C | 8 | Cu | Foil transfer | 2.1 | 0.1 | Yes | — |
| 15 | 3-C | 9 | Cu | Foil transfer | 2.2 | 0.1 | No | 2 |
| 16 | 3-C | 10 | Cu | Foil transfer | 2.0 | 0.2 | No | 2 |
| 17 | 3-C | 11 | Cu | Foil transfer | 2.1 | 0.2 | No | 2 |
| 18 | 3-C | 4 | Ag | Foil transfer | 1.8 | 0.1 | No | 3 |
| 19 | 3-C | 4 | Ag/Pd | Foil transfer | 2.0 | 0.2 | No | 2 |
| 20 | 3-C | 4 | Ag/Pt | Foil transfer | 2.2 | 0.2 | No | 3 |
| ✕21 | 3-C | 4 | Cu | Paste printing | Wire breakage | 0.1 | No | 3 |

As is apparent from Table 3-3, regarding the sample number 1 wherein the glass content in the substrate material is less than 20%, and the sample number 7 wherein the glass content in the restricting sheet is less than 0.5% by volume, the restricting sheet was peeled off during firing. Therefore, shrinkage on firing occurred and the condition of the surface of the substrate was rough and showed a void percentage of more than 5%.

Regarding the sample number 14 wherein the glass content in the restricting sheet is more than 5% by volume, the restricting sheet was adhered too strongly to peel it off. In the Comparative Example, regarding the sample number 21 wherein the wiring circuit layer was formed by a screen printing process, wire breakage occurred. In the other samples using a metal foil, a good wiring circuit layer could be formed without any difficulties. Example 4 (corresponding to the second embodiment)

First, 70% by weight of borosilicate glass powder and 30% by weight of $SiO_2$ powder were weighted, and then an acrylic resin as a binder for molding, DBP (dibutyl phthalate) as a plasticizer and toluene as a solvent were added, followed by mixing to prepare a slurry. Using the slurry, a green sheet having a thickness of 300 $\mu$m was made by a doctor blade process. Using this ceramic powder composition, the thermal expansion coefficient after firing was determined. As a result, it was 10 ppm/° C. at 40 to 400° C.

Then, an acrylic resin as an organic binder and DBP as a solvent were added to Cu powder having an average particle diameter of 5 $\mu$m, followed by kneading to prepare a conductive paste for via holes. Via holes were formed at the predetermined positions on the green sheet by punching and the holes were filled with the conductive paste.

An adhesive was coated on the surface of the transfer film of polyethylene terephthalate (PET) and an electrolytic copper foil or silver foil having a thickness of 12 $\mu$m was bonded thereto. Then, a photosensitive resist was coated on the surface of the metal foil, exposed to light through a glass mask to form a wiring pattern. Non-patterned portion was removed by etching by dipping in a ferric chloride solution to form a wiring circuit layer. After the resist was peeled off, the top and side of the wiring circuit layer were treated with 10% formic acid and the roughening rate was controlled by changing the dipping time of the etched layer.

As the wiring circuit layer, for example, a fine pattern having a wiring width (bottom width when the cross section has a trapezoidal shape) of 50 $\mu$m and a distance between wirings (wiring pitch) of 50 $\mu$m was used, excluding patterns for each measurement.

The etching treatment and roughening treatment were carried out under the conditions shown in Tables 4-1a and 4-1b, respectively. An average angle of 10 measuring points was determined by the observation of the cross section of the wiring circuit layer using a scanning electron microscope (SEM) and, at the same time, the plane surface roughness (Ra) was determined by an atomic force microscope (AMF). The results are shown in Tables 4-1a and 4-1b.

After the transfer film provided with a wiring circuit layer and the green sheet were positioned, the wiring circuit layer was embedded so that the surface of the wiring circuit layer and that of the green sheet are flush by pressing at 60° C. under a pressure of 30 kg/cm² for 30 seconds using a vacuum laminating machine. Then, only the transfer film and adhesive layer were peeled off and the wiring circuit layer was transferred to form a wiring sheet. Furthermore, five wiring sheets having a wiring circuit layer and via hole conductor were made in the same manner and six wiring sheets were integrated by laminating at 60° C. under a pressure of 200 kg/cm².

Finally, the laminate was maintained at 700° C. in a nitrogen atmosphere for one hour to decompose and remove organic components such as organic binder. Then, the laminate was maintained at 900° C. for one hour in the same atmosphere while uniaxially pressuring under a pressure of 200 kg/cm² to form a multi-layer wiring substrate.

200 samples were made and the conduction of the wiring circuit layer and the insulation between the wiring circuit layers were evaluated. Samples with defects were removed and a final yield was determined. Samples with a yield of not less than 85% were rated pass.

With respect to the resulting wiring substrate, the conduction resistance of the wiring circuit layer was evaluated. The wiring resistance of a copper wiring circuit layer having a width of 50 μm and a length of 20 mm was measured by using a tester, while the thickness, width and length of the wiring circuit layer were determined by using a scanning electron microscope (SEM) or a optical microscope, and then the resistivity of the wiring circuit layer was calculated. Samples having the resistivity of not more than 2.0 μΩcm were rated good.

The adhesive strength of the wiring circuit layer formed on the surface of these wiring substrates was determined. The determination was carried out as follows. That is, a Sn-plated Cu lead was bonded to a pad of 2 mm×2 mm formed as a wiring circuit network by means of soldering, the load was measured when the Cu lead is detached by vertically pulling the Cu lead. Samples having an adhesion strength of 2.0 kgf/(2 mm×2 mm) or more were rated good.

For comparison, a multi-layer wiring substrate was made in the very same manner as described above, except that the wiring circuit layer was formed on the surface of the green sheet by a screen printing process using the conductive paste for via hole conductor, and then the multi-layer wiring substrate was evaluated in the very same manner as described above. The results are shown in Tables 4-1a and 4-1b.

TABLE 4-1a

| Sample No. | Metal conductor Types | Purity % | Conductor forming method | Yield % | Resistivity μΩ·cm | Etching rate μm/min. |
|---|---|---|---|---|---|---|
| *1  | Cu | 99.8 | Transfer | 83 | 1.9 | 55 |
| 2   | Cu | 99.8 | Transfer | 87 | 1.9 | 50 |
| 3   | Cu | 99.8 | Transfer | 90 | 1.9 | 40 |
| 4   | Cu | 99.8 | Transfer | 91 | 1.9 | 10 |
| 5   | Cu | 99.8 | Transfer | 90 | 2.0 | 2 |
| *6  | Cu | 99.8 | Transfer | 89 | 2.0 | 1 |
| 7   | Cu | 99.8 | Transfer | 92 | 1.9 | 35 |
| 8   | Cu | 99.8 | Transfer | 90 | 1.9 | 35 |
| 9   | Cu | 99.8 | Transfer | 90 | 1.9 | 35 |
| *10 | Ag | 99.8 | Transfer | 80 | 1.8 | 65 |
| 11  | Ag | 99.8 | Transfer | 86 | 1.8 | 60 |
| 12  | Ag | 99.8 | Transfer | 89 | 1.8 | 5 |
| *13 | Ag | 99.8 | Transfer | 88 | 1.8 | 3 |
| 14  | Ag | 99.8 | Transfer | 88 | 1.8 | 50 |
| 15  | Ag | 99.8 | Transfer | 90 | 1.8 | 50 |
| *16 | Cu | 95.0 | Printing | 50 | 3.5 | — |
| *17 | Ag | 95.0 | Printing | 47 | 3.3 | — |

The symbol * represents a sample that is not rated good.

TABLE 4-1b

| Sample No. | Angle α° degree | Roughening rate | Wiring surface roughness, nm Top (lower side) | Sloped side | Adhesive strength kg/(2 mm × 2 mm) |
|---|---|---|---|---|---|
| *1  | 85 | 2   | 450 | 180 | 1.6 |
| 2   | 80 | 2   | 450 | 200 | 2.3 |
| 3   | 75 | 2   | 450 | 350 | 2.7 |
| 4   | 60 | 2   | 450 | 450 | 3.5 |
| 5   | 45 | 2   | 450 | 450 | 2.5 |
| *6  | 40 | 2   | 450 | 450 | 1.5 |
| 7   | 60 | 0.8 | 200 | 200 | 2.0 |
| 8   | 60 | 1   | 220 | 220 | 2.2 |
| 9   | 60 | 3   | 590 | 590 | 3.6 |
| *10 | 85 | 3   | 450 | 170 | 1.5 |
| 11  | 80 | 3   | 450 | 200 | 2.2 |
| 12  | 45 | 3   | 450 | 450 | 2.6 |
| *13 | 40 | 3   | 450 | 450 | 1.4 |

TABLE 4-1b-continued

| | | | Wiring surface roughness, nm | | |
|---|---|---|---|---|---|
| Sample No. | Angle α° degree | Roughening rate | Top (lower side) | Sloped side | Adhesive strength kg/(2 mm × 2 mm) |
| 14 | 60 | 0.8 | 200 | 200 | 2.0 |
| 15 | 60 | 2 | 220 | 220 | 3.3 |
| *16 | — | — | — | — | 2.5 |
| *17 | — | — | — | — | 2.6 |

As is apparent from Tables 4-1a and 4-1b, the wiring circuit layer having an adhesive strength of 2 kgf/(2 mm×2 mm) or more and a low resistivity of 2 $\mu\Omega$cm or less could be formed by forming the wiring circuit layer with a high-purity metal conductor in concentration of 99% by weight, embedding the wiring circuit layer so that the wiring circuit layer has a cross section of inverted trapezoidal shape in the direction perpendicular to the wiring direction and the angle made between the bottom and sloped side of the inverted trapezoid shape is within a range from 45 to 80°. Besides, the yield of 85% ore more could be attained. Furthermore, as the surface roughness of the top and sloped side increased, the adhesive strength tended to increase. The good results were obtained at an adhesive strength of 200 nm or more.

In the sample numbers 16 and 17 wherein the wiring circuit layer was formed by a conventional printing process, the yield of the wiring circuit network was low such as 50% or less and the resistivity was high such as 3 $\mu\Omega$cm or more.

In the sample numbers 1 and 10 wherein the angle a is larger than 80°, it becomes difficult to roughen the side (sloped side) of the wiring circuit layer. As a result, the adhesive strength is reduced and embedding is hardly conducted when the circuit pattern on the transfer film is contact-bonded to the green sheet, thereby lowering the yield. In the sample numbers 6 and 13 wherein the angle α is smaller than 45°, the adhesive strength was lowered.

Furthermore, products of the present invention in Tables 4-1a and 4-1b were subjected to evaluation of mounting. According to the evaluation, connection pads were previously formed on the resulting wiring substrate and connection terminals made of solder (comprising 10 to 60% of tin and 40 to 90% of lead) were attached to the connection pads. The connection terminals were formed on the entire bottom surface of the wiring substrate in a density of 30 terminals per 1 cm². On the other hand, a printed circuit board comprised of a glass-epoxy substrate (thermal expansion coefficient of 15 ppm/° C. ) and a wiring conductor formed on the glass-epoxy substrate was prepared and the wiring substrate was positioned to connect the wiring conductor of the printed circuit board to each connection terminal. The wiring substrate was mounted on the surface of the printed circuit board after subjecting to a heat treatment at 230° C. in a nitrogen atmosphere for three minutes. It was confirmed that the connection terminals made of solder were molten to electrically connect to the wiring conductor of the printed circuit board by this heat treatment.

The test samples wherein the glass ceramic wiring substrate was mounted on the surface of the printed circuit board were maintained in turn in constant temperature bathes controlled at temperatures of −40° C. and 125° C., respectively, in an air for each 15 minutes. Using this process as one cycle, the heat cycles were applied. As a result, no change in electrical resistance between the wiring conductor of the printed circuit board and the wiring substrate did not arise even after 1000 cycles, thus exhibiting excellent reliability of mounting.

The present invention has been described in detail with reference to the embodiments thereof. These embodiments are therefore to be construed as illustrative and not restrictive, the spirit and the scope of the present invention being limited only by the attended claims.

The present application claims the priority benefits under 35 U.S.C. Section 119 based on Patent Application No. 11-275055 filed to Japanese Patent of office on Sep. 28, 1999; Patent Application No. 11-185929 filed to Japanese Patent Office on Jun. 30, 1999; Patent Application No. 11-366870 filed to Japanese Patent Office on Dec. 24, 1999; and Patent Application No. 11-185829 filed to Japanese Patent Office on Jun. 30, 1999, all disclosures of which are incorporated herein by reference.

What is claimed is:

1. A wiring substrate, comprising:
an insulating substrate containing glass ceramics having a Young's modulus of 120 GPa or less, and
a wiring circuit layer made of a high-purity metal conductor in concentration of 99% by weight or more formed on the surface of the insulating substrate and/or inside thereof.

2. The wiring substrate according to claim 1, which is a multi-layer wiring substrate that has a plurality of wiring circuit layers.

3. The wiring substrate according to claim 1, wherein the wiring circuit layer is made of high-purity metal conductor including a metal component of 99.5% or higher purity.

4. The wiring substrate according to claim 1, wherein the wiring circuit layer is made of at least one metal selected from the group consisting of Cu, Ag, Al, Ni, Pt and Pd.

5. The wiring substrate according to claim 1, wherein the wiring circuit layer is made of a metal foil.

6. The wiring substrate according to claim 1, further comprising a via hole conductor made by filling through holes formed in the insulating substrate with a conductive paste containing metal powders, at least one end of the via hole conductor being connected to a wiring circuit layer of the high-purity metal conductor.

7. The wiring substrate according to claim 1, wherein a difference in a thermal expansion coefficient between the insulating substrate and the wiring circuit layer is 14 ppm/° C. or less at a temperature within a range from 25 to 800° C.

8. The wiring substrate according to claim 7, wherein the thermal expansion coefficient of the insulating substrate is 8 ppm/° C. or more at a temperature within a range from 25 to 800° C.

9. The wiring substrate according to claim 1, wherein the insulating substrate includes 20% by volume or more amorphous component with not more than 5% of the outer-most surface thereof being occupied by voids.

10. The wiring substrate according to claim 1, wherein the wiring circuit layer is made of a metal foil and is embedded in the insulating substrate.

11. The wiring substrate according to claim 1, wherein the insulating substrate is made by firing a material selected from the group consisting of glass powder, a mixture of glass powder and ceramic filler powder, and ceramic powder.

12. A wiring substrate comprising:

an insulating substrate containing glass ceramics having a Young's modulus of 120 GPa or less, and a wiring circuit layer made of a high-purity metal conductor in concentration of 99% by weight or more formed on the surface of the insulating substrate and/or inside thereof, wherein the wiring circuit layer is embedded in the ceramic insulating substrate so that surfaces thereof are substantially flush, and the wiring circuit layer has a cross section of inverted trapezoidal shape in a direction perpendicular to a wiring direction.

13. The wiring substrate according to claim 12, wherein an angle made between a bottom and sloped side of the inverted trapezoid shape is within a range from 45 to 80°.

14. The wiring substrate according to claim 12, wherein the average surface roughness of the surface embedded in the insulating substrate of the surface wiring circuit layer is 200 nm or higher.

15. The wiring substrate according to claim 12, wherein the average thermal expansion coefficient of the insulating substrate is 6 ppm/° C. or higher at a temperature within a range from 40 to 400° C.

16. A wiring substrate, comprising:

an insulating substrate containing glass ceramics, and a wiring circuit layer that is formed at least inside of the insulating substrate and is made of a metal conductor in concentration of 99% by weight or more such that a difference in a thermal expansion coefficient between the insulating substrate and the wiring circuit layer is 14 ppm/° C. or less at a temperature within a range from 25 to 800° C.

17. A wiring substrate, comprising:

an insulating substrate that is made of glass ceramics and includes 20% by volume or more amorphous component with less than 5% of an outer-most surface thereof being occupied by voids, and a wiring circuit layer made of a high-purity metal conductor of 99.5% by weight or more content formed on the surface of the insulating substrate and/or inside thereof.

18. A wiring substrate, comprising:

an insulating substrate made of ceramics, and a wiring circuit layer made of a high-purity metal conductor of 99% by weight or more embedded in the ceramic insulating substrate so that the surfaces thereof are flush, wherein the wiring circuit layer has a cross section of inverted trapezoid shape in a direction perpendicular to a wiring direction.

19. The wiring substrate according to claim 18, wherein an angle made between a bottom and sloped side of the inverted trapezoid shape is within a range from 45 to 800°.

* * * * *